(12) United States Patent
Kasai et al.

(10) Patent No.: US 11,067,616 B2
(45) Date of Patent: Jul. 20, 2021

(54) CONNECTING-STATE DETECTION SYSTEM

(71) Applicant: SHIMANO INC., Sakai (JP)

(72) Inventors: Yoshiyuki Kasai, Sakai (JP); Takafumi Suzuki, Sakai (JP); Makoto Usui, Sakai (JP)

(73) Assignee: SHIMANO INC., Sakai (JP)

(*) Notice: Subject to any disclaimer, the term of this patent is extended or adjusted under 35 U.S.C. 154(b) by 174 days.

(21) Appl. No.: 16/414,843

(22) Filed: May 17, 2019

(65) Prior Publication Data
US 2020/0363461 A1 Nov. 19, 2020

(51) Int. Cl.
G01R 31/00 (2006.01)
B62J 99/00 (2020.01)
B62J 45/20 (2020.01)
B62J 50/20 (2020.01)

(52) U.S. Cl.
CPC ............ *G01R 31/005* (2013.01); *B62J 99/00* (2013.01); *B62J 45/20* (2020.02); *B62J 50/20* (2020.02)

(58) Field of Classification Search
CPC ......... G01R 31/005; B62J 99/00; B62J 45/20; B62J 50/20; B62J 6/015; B62J 2001/085; B62J 45/40; B62J 43/30; B62K 2025/045
USPC ................................ 324/500, 503, 508, 509
See application file for complete search history.

(56) References Cited

U.S. PATENT DOCUMENTS

| | | | | |
|---|---|---|---|---|
| 2,018,024 | A * | 10/1935 | Kress | A47F 3/001 34/88 |
| 2008/0252297 | A1 | 10/2008 | Miglioranza | |
| 2011/0300753 | A1 * | 12/2011 | Ichikawa | B60L 3/0069 439/620.21 |
| 2013/0027052 | A1 | 1/2013 | Matsumoto et al. | |
| 2013/0260595 | A1 * | 10/2013 | Tamaki | B62J 99/00 439/345 |
| 2014/0368211 | A1 * | 12/2014 | Inoue | B60L 3/04 324/509 |
| 2018/0022169 | A1 * | 1/2018 | Markert | G07C 5/00 340/442 |
| 2018/0066460 | A1 * | 3/2018 | Koizumi | E05B 81/77 |
| 2018/0120123 | A1 * | 5/2018 | Seok | B60L 15/20 |
| 2018/0152031 | A1 * | 5/2018 | Zhai | H02J 7/0013 |
| 2019/0176654 | A1 * | 6/2019 | Lee | G01R 19/1659 |

* cited by examiner

*Primary Examiner* — Giovanni Astacio-Oquendo
(74) *Attorney, Agent, or Firm* — Mori & Ward, LLP

(57) ABSTRACT

A connecting-state detection system for a power supply system of a human-powered vehicle comprises a detector. The power supply system includes a power supply device having a plurality of connecting terminals. The detector is configured to detect a connecting state of each of the plurality of the connecting terminals.

16 Claims, 14 Drawing Sheets

| ELECTRIC COMPONENT | IDENTIFIER | RATED CURRENT [mA] |
|---|---|---|
| DIV1 | ID1 | RC1 |
| DIV2 | ID2 | RC2 |
| LD | ID3 | RC3 |
| FS | ID4 | RC4 |
| RS | ID5 | RC5 |
| SA | ID6 | RC6 |
| FD | ID7 | RC7 |
| RD | ID8 | RC8 |

CONNECTING-STATE DETECTION SYSTEM

BACKGROUND OF THE INVENTION

Field of the Invention

The present invention relates to a connecting-state detection system.

Discussion of the Background

A human-powered vehicle includes a system configured to supply electricity to a plurality of electric components.

SUMMARY OF THE INVENTION

In accordance with a first aspect of the present invention, a connecting-state detection system for a power supply system of a human-powered vehicle comprises a detector. The power supply system includes a power supply device having a plurality of connecting terminals. The detector is configured to detect a connecting state of each of the plurality of the connecting terminals.

With the connecting-state detection system according to the first aspect, it is possible to recognize the connecting state of each of the plurality of connecting terminals with respect to a plurality of electric components. Thus, it is possible to distribute load applied to the plurality of connecting terminals by change the connecting state as necessary.

In accordance with a second aspect of the present invention, the connecting-state detection system according to the first aspect is configured so that the plurality of connecting terminals includes at least three connecting terminals.

With the connecting-state detection system according to the second aspect, it is possible to reduce load applied to the plurality of connecting terminals.

In accordance with a third aspect of the present invention, the connecting-state detection system according to the first or second aspect is configured so that the connecting state includes electrical-load information relating to each of the plurality of the connecting terminals. The detector is configured to detect the electrical-load information of the plurality of the connecting terminals.

With the connecting-state detection system according to the third aspect, it is possible to recognize the electrical-load information relating to each of the plurality of connecting terminals. Thus, it is possible to reliably distribute load applied to the plurality of connecting terminals by change the connecting state as necessary.

In accordance with a fourth aspect of the present invention, the connecting-state detection system according to the third aspect is configured so that the detector is configured to detect at least one of a current applied to the plurality of connecting terminals, a voltage applied to the plurality of connecting terminals, a temperature applied to the plurality of connecting terminals, an identifier of at least one electric component of a plurality of electric components connected to the plurality of connecting terminals, and a total number of the plurality of electric components connected to the plurality of connecting terminals.

With the connecting-state detection system according to the fourth aspect, it is possible to reliably recognize the electrical-load information relating to each of the plurality of connecting terminals.

In accordance with a fifth aspect of the present invention, the connecting-state detection system according to the fourth aspect is configured so that the detector is configured to determine, based on the identifier of the at least one electric component of the plurality of electric components, a value indicating a load of the at least one electric component.

With the connecting-state detection system according to the fifth aspect, it is possible to recognize the load relating to the at least one electric component.

In accordance with a sixth aspect of the present invention, the connecting-state detection system according to the fifth aspect is configured so that the detector is configured to calculate, based on the value indicating the load of the at least one electric component, a total indicating a total load of the at least one electric component connected to each of the plurality of connecting terminals.

With the connecting-state detection system according to the sixth aspect, it is possible to reliably recognize the load relating to the at least one electric component.

In accordance with a seventh aspect of the present invention, the connecting-state detection system according to any one of the first to sixth aspects further comprises an information device is configured to inform the connecting state between the plurality of the connecting terminals and a plurality of electric components connected to the plurality of the connecting terminals.

With the connecting-state detection system according to the seventh aspect, it is possible to inform the user of the connecting state.

In accordance with an eighth aspect of the present invention, the connecting-state detection system according to the seventh aspect is configured so that the information device is configured to inform a state in which the electrical-load information is higher than a predetermined electrical load.

With the connecting-state detection system according to the eighth aspect, it is possible to inform the user of the state in which the electrical-load information is higher than the predetermined electrical load. Thus, it is easier for the user to distribute the load of the plurality of connecting terminals.

In accordance with a ninth aspect of the present invention, the connecting-state detection system according to the seventh or eighth aspect is configured so that the information device is configured to inform a connecting suggestion in accordance with comparison of the electrical-load information between the plurality of the connecting terminals.

With the connecting-state detection system according to the ninth aspect, it is possible to reliably recognize the electrical-load information of the plurality of the connecting terminals.

In accordance with a tenth aspect of the present invention, the connecting-state detection system according to any one of the seventh to ninth aspects is configured so that the information device is configured to be connected to a wireless communicator.

With the connecting-state detection system according to the tenth aspect, it is possible to wirelessly transmit information to the information device.

In accordance with an eleventh aspect of the present invention, the connecting-state detection system according to any one of the seventh to tenth aspects is configured so that the information device includes a display.

With the connecting-state detection system according to the eleventh aspect, it is possible to display the connecting state on the display to inform the user of the connecting state.

In accordance with a twelfth aspect of the present invention, the connecting-state detection system according to any one of the seventh to eleventh aspects is configured so that the information device includes an external device separately provided with respect to the one of the human-powered vehicle and the power supply system.

With the connecting-state detection system according to the twelfth aspect, it is possible to inform the user of the connecting state using external device of the information device.

In accordance with a thirteenth aspect of the present invention, the connecting-state detection system according to any one of the first to twelfth aspects is configured so that the detector is provided to the power supply device.

With the connecting-state detection system according to the thirteenth aspect, it is possible to utilize the power supply device as a space for the detector.

In accordance with a fourteenth aspect of the present invention, the connecting-state detection system according to any one of the first to thirteenth aspects is configured so that the plurality of electric components includes at least one of a transmission, a suspension, a seatpost assembly, an operating device, and a light emitting device.

With the connecting-state detection system according to the fourteenth aspect, it is possible to connect a variety of electric components to the power supply system.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 6 is a table including rated currents of possible electric components connectable to a plurality of connecting terminals.

DESCRIPTION OF THE EMBODIMENTS

Figure 1:
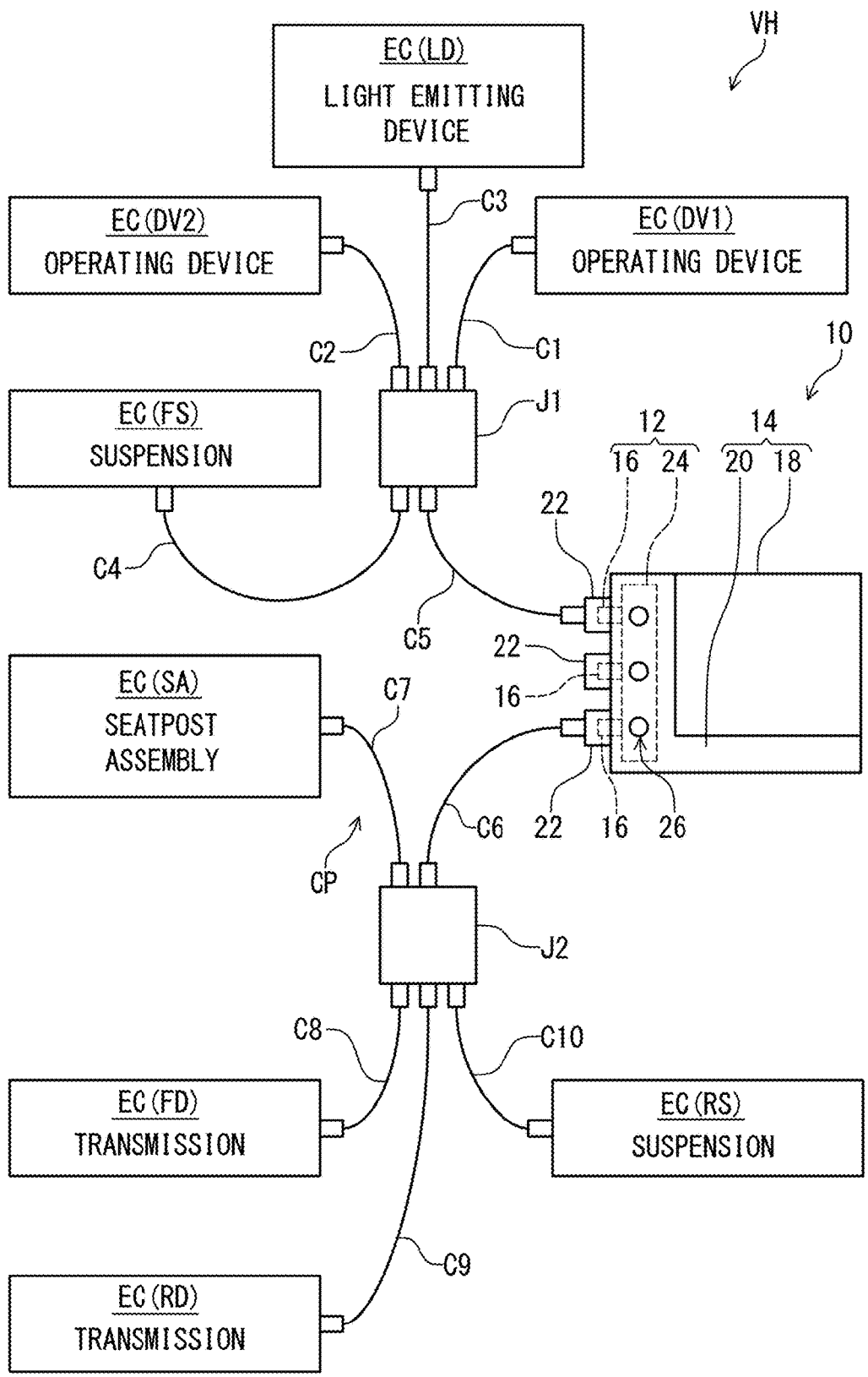
FIG. 1 is a schematic block diagram of a human-powered vehicle including a power supply system including a connecting-state detection system in accordance with a first embodiment.

The embodiment(s) will now be described with reference to the accompanying drawings, wherein like reference numerals designate corresponding or identical elements throughout the various drawings.

First Embodiment

Referring initially to FIG. 1, a power supply system 10 of a human-powered vehicle VH comprises a connecting-state detection system 12 in accordance with a first embodiment. The human-powered vehicle VH comprises a plurality of electric components EC. The power supply system 10 includes a power supply device 14 having a plurality of connecting terminals 16. The plurality of connecting terminals 16 is configured to be electrically connected to the plurality of electric components EC. In this embodiment, the plurality of electric components EC includes at least one of a transmission, a suspension, a seatpost assembly, an operating device, and a light emitting device. The plurality of electrical components EC includes a transmission FD, a transmission RD, a suspension FS, a suspension RS, a seatpost assembly SA, an operating device DV1, an operating device DV2, and a light emitting device LD. However, the plurality of electric components EC is not limited to this embodiment.

For example, the human-powered vehicle VH is a vehicle to travel with a motive power including at least a human power of a user who rides the human-powered vehicle VH (i.e., rider). The human-powered vehicle VH has an arbitrary number of wheels. For example, the human-powered vehicle VH has at least one wheel. In this embodiment, the human-powered vehicle VH preferably has a smaller size than that of a four-wheeled automobile. However, the human-powered vehicle VH can have an arbitrary size. Examples of the human-powered vehicle VH include a bicycle, a tricycle, and a kick scooter. In this embodiment, the human-powered vehicle VH is a bicycle. An electric assisting system including an electric motor can be applied to the human-powered vehicle VH (e.g., the bicycle) to assist muscular motive power of the user. Namely, the human-powered vehicle VH can be an E-bike. While the human-powered vehicle VH is illustrated as a mountain bike, the power supply system 10 and the connecting-state detection system 12 can be applied to road bikes or any type of human-powered vehicles.

The operating device DV1 is configured to generate control signals to control the transmission RD, the suspension RS, and the seatpost assembly SA in response to user inputs. The operating device DV2 is configured to generate control signals to control the transmission FD, the suspension FS, and the light emitting device LD in response to user inputs.

The transmission FD is configured to change a gear position of the human-powered vehicle VH. For example, the transmission FD includes a front derailleur. The transmission FD is configured to change the gear position of the human-powered vehicle VH. For example, the transmission RD include a rear derailleur. The suspension FS is configured to absorb shock applied to a vehicle body of the human-powered vehicle VH. For example, the suspension FS includes a front suspension mounted to a front fork. The suspension RS is configured to absorb shock applied to the vehicle body of the human-powered vehicle VH. For example, the suspension RS includes a rear suspension mounted to the vehicle body. The seatpost assembly SA is configured to change a height of a saddle attached to the seatpost assembly SA. The light emitting device LD includes a light emitting element configured to emit light.

In the present application, the following directional terms "front," "rear," "forward," "rearward," "left," "right," "transverse," "upward" and "downward" as well as any other similar directional terms refer to those directions which are determined on the basis of a user (e.g., a rider)

who sits on a saddle of the human-powered vehicle VH with facing a handlebar. Accordingly, these terms, as utilized to describe the connecting-state detection system 12 or other components, should be interpreted relative to the human-powered vehicle VH equipped with the connecting-state detection system 12 as used in an upright riding position on a horizontal surface.

The power supply device 14 includes an electric power source 18 and a holder 20. The electric power source 18 is configured to supply electricity from the plurality of connecting terminals 16 to a plurality of electric components EC connected to at least one of the plurality of connecting terminals 16. The electric power source 18 is configured to be detachably attached to the holder 20. Examples of the electric power source 18 include a battery. However, the electric power source 18 is not limited to the battery. The structure of the power supply device 14 is not limited to this embodiment. For example, the holder 20 can be omitted from the power supply device 14.

The power supply system 10 includes an electric communication path CP. The holder 20 is electrically connected to the connecting-state detection system 12 with the electric communication path CP. The electric communication path CP includes first to tenth electric cables C1 to C10 and first and second junctions J1 and J2. Each of the first to tenth electric cables C1 to C10 is detachably connectable to each of the power supply device 14, the transmission FD, the transmission RD, the suspension FS, the suspension RS, the seatpost assembly SA, the operating device DV1, the operating device DV2, the light emitting device LD, the first junction J1, and the second junction J2. At least one of the first and second junctions J1 and J2 can be omitted from the electric communication path CP. In such embodiments, at least one of the transmission FD, the transmission RD, the suspension FS, the suspension RS, the seatpost assembly SA, the operating device DV1, the operating device DV2, the light emitting device LD can be directly connected to the connecting-state detection system 12. At least two cables of the electric cables C1 to C4 and C7 to C10 can be integrated to a single electric cable.

The term "detachably" as used herein encompasses a configuration in which an element is repeatedly detachable from another element without substantial damage.

The operating device DV1 is electrically connected to the first junction J1 with the first electric cable C1. The operating device DV2 is electrically connected to the first junction J1 with the second electric cable C2. The light emitting device LD is electrically connected to the first junction J1 with the third electric cable C3. The suspension FS is electrically connected to the first junction J1 with the fourth electric cable C4. The power supply device 14 is electrically connected to the first junction J1 with the fifth electric cable C5.

The power supply device 14 is electrically connected to the second junction J2 with the sixth electric cable C6. The seatpost assembly SA is electrically connected to the second junction J2 with the seventh electric cable C7. The transmission FD is electrically connected to the second junction J2 with the eighth electric cable C8. The transmission RD is electrically connected to the second junction J2 with the ninth electric cable C9. The suspension RS is electrically connected to the second junction J2 with the tenth electric cable C10.

Figure 2:
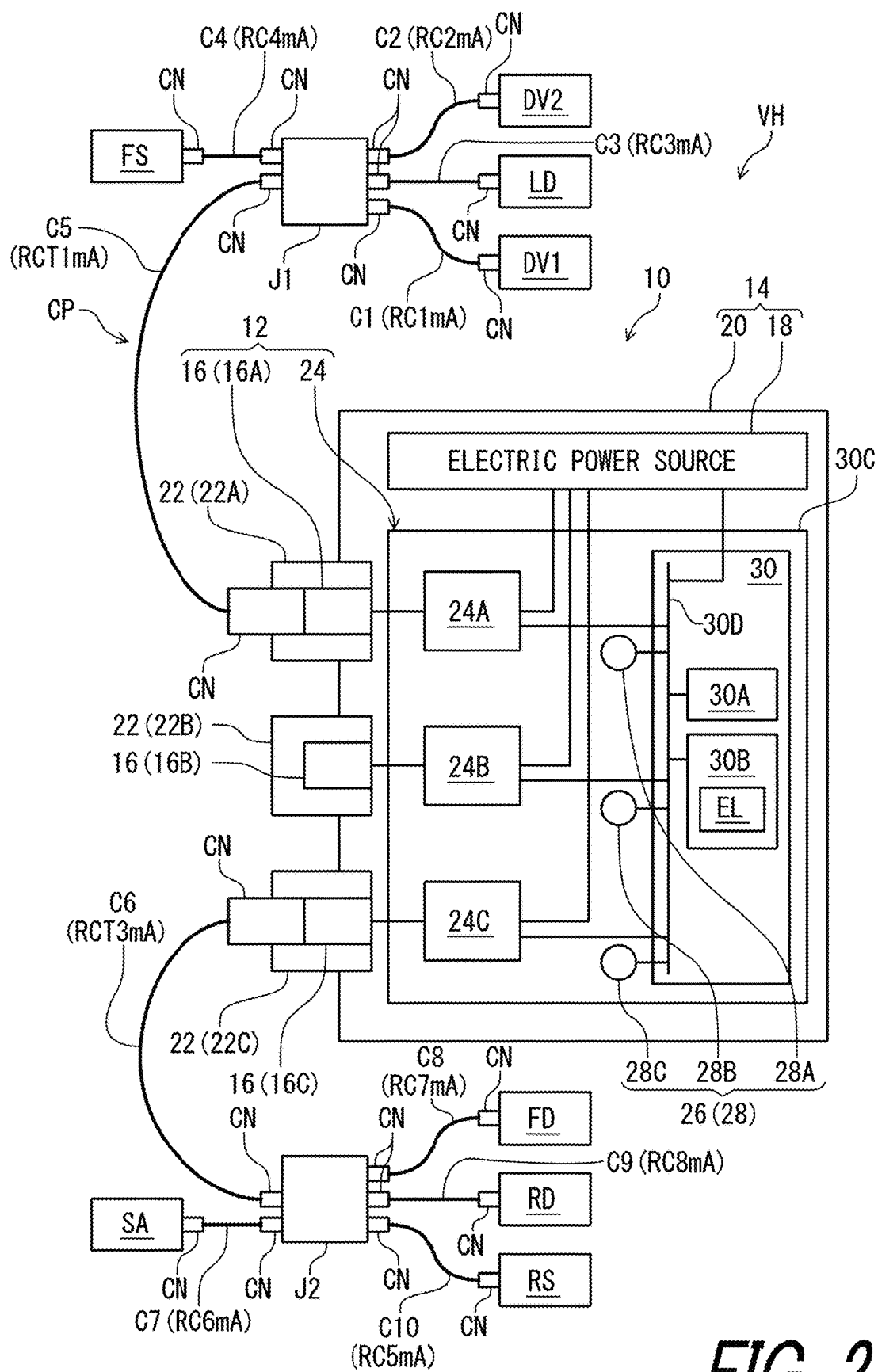
FIG. 2 is a schematic block diagram of the power supply system including the connecting-state detection system illustrated in FIG. 1.

As seen in FIG. 2, the power supply device 14 includes a plurality of connection ports 22. The plurality of connecting terminals 16 is provided in the plurality of connection ports 22. The connecting-state detection system 12 for the power supply system 10 of the human-powered vehicle VH comprises a detector 24. The detector 24 is configured to detect a connecting state of each of the plurality of the connecting terminals 16. The connecting state includes electrical-load information relating to each of the plurality of the connecting terminals 16. The detector 24 is configured to be electrically connected to the plurality of connecting terminals 16. In this embodiment, the detector 24 is provided to the power supply device 14. The detector 24 is provided in the holder 20. However, the detector 24 can be provided to positions other than the power supply device 14.

In this embodiment, the plurality of connecting terminals 16 includes at least three connecting terminals 16. The plurality of connection ports 22 includes at least three connection ports 22. The plurality of connecting terminals 16 includes a first connecting terminal 16A, a second connecting terminal 16B, and a third connecting terminal 16C. The detector 24 is configured to be electrically connected to the first connecting terminal 16A to detect a first connecting state of the first connecting terminal 16A. The detector 24 is configured to be electrically connected to the second connecting terminal 16B to detect a second connecting state of the second connecting terminal 16B. The detector 24 is configured to be electrically connected to the third connecting terminal 16C to detect a third connecting state of the third connecting terminal 16C.

The plurality of connection ports 22 includes a first connection port 22A, a second connection port 22B, and a third connection port 22C. The first connecting terminal 16A is provided in the first connection port 22A. The second connecting terminal 16B is provided in the second connection port 22B. The third connecting terminal 16C is provided in the third connection port 22C. However, a total number of the plurality of connecting terminals 16 is not limited to this embodiment. A total number of the plurality of connection ports 22 is not limited to this embodiment.

Each of the first to tenth electric cables C1 to C10 includes a pair of connectors CN. Each of the plurality of connection ports 22 is configured to be connected to each of the pair of connectors CN. The first connection port 22A is configured to be detachably connected to the connector CN. The second connection port 22B is configured to be detachably connected to the connector CN. The third connection port 22C is configured to be detachably connected to the connector CN.

The transmission FD, the transmission RD, the suspension FS, the suspension RS, the seatpost assembly SA, the operating device DV1, the operating device DV2, the light emitting device LD, and the display device DP are configured to communicate with each other via the electric communication path CP using power line communication technology.

Power line communication (PLC) carries data on a conductor that is also used simultaneously for electric power transmission or electric power distribution to plurality of electric components EC. In this embodiment, the electric power is supplied from the power supply device 14 to the connecting-state detection system 12, the transmission FD, the transmission RD, the suspension FS, the suspension RS, the seatpost assembly SA, the operating device DV1, the operating device DV2, the light emitting device LD, and the display device DP via the electric communication path CP. Furthermore, the transmission FD, the transmission RD, the suspension FS, the suspension RS, the seatpost assembly SA, the operating device DV1, the operating device DV2, the light emitting device LD, and the display device DP send and receive control signals via the electric communication path CP using the PLC.

The PLC uses unique identifying information such as a unique identifier that is assigned to each of the transmission FD, the transmission RD, the suspension FS, the suspension RS, the seatpost assembly SA, the operating device DV1, the operating device DV2, and the light emitting device LD. For example, each of the transmission FD, the transmission RD, the suspension FS, the suspension RS, the seatpost assembly SA, the operating device DV1, the operating device DV2, and the light emitting device LD includes a controller in which the unique identifying information is stored. Based on the unique identifying information, each of the transmission FD, the transmission RD, the suspension FS, the suspension RS, the seatpost assembly SA, the operating device DV1, the operating device DV2, and the light emitting device LD can recognize control signals which are necessary for itself among control signals transmitted via the electric communication path CP.

The detector 24 is configured to detect the electrical-load information of the plurality of the connecting terminals 16. For example, the detector 24 is configured to detect at least one of a current applied to the plurality of connecting terminals 16, a voltage applied to the plurality of connecting terminals 16, a temperature applied to the plurality of connecting terminals 16, an identifier of each of a plurality of electric components EC connected to the plurality of connecting terminals 16, and a total number of the plurality of electric components EC connected to the plurality of connecting terminals 16. In this embodiment, the detector 24 is configured to detect the current applied to the plurality of connecting terminals 16 and the total number of the plurality of electric components EC connected to the plurality of connecting terminals 16. However, the electrical-load information detected by the detector 24 is not limited to this embodiment.

The detector 24 includes a first information detector 24A, a second information detector 24B, and a third information detector 24C. The first information detector 24A is configured to detect the electrical-load information relating to the first connecting terminal 16A. The second information detector 24B is configured to detect the electrical-load information relating to the second connecting terminal 16B. The third information detector 24C is configured to detect the electrical-load information relating to the third connecting terminal 16C. In this embodiment, the first information detector 24A is configured to measure a current flowing through the first connecting terminal 16A. The second information detector 24B is configured to measure a current flowing through the second connecting terminal 16B. The third information detector 24C is configured to measure a current flowing through the third connecting terminal 16C.

The connecting-state detection system 12 further comprises an information device 26. The information device 26 is configured to inform the connecting state between the plurality of the connecting terminals 16 and the plurality of electric components EC connected to the plurality of the connecting terminals 16.

In this embodiment, the information device 26 includes a display 28. The display 28 is mounted to the power supply device 14. The display 28 includes a first indicator 28A, a second indicator 28B, and a third indicator 28C. Each of the first indicator 28A, the second indicator 28B, and the third indicator 28C is mounted to the holder 20 of the power supply device 14. Each of the first indicator 28A, the second indicator 28B, and the third indicator 28C includes a light-emitting element such as a light-emitting diode (LED). Each of the first indicator 28A, the second indicator 28B, and the third indicator 28C is configured to emit first light and second light having a color (e.g., red) different from a color (e.g., green) of the first light. The information device 26 is not limited to this embodiment. The information device 26 can include an electric device configured to display the connecting state with graphics, configured to generate vibration indicating the connecting state, and/or configured to output sound indicating the connecting state instead of or in addition to the display 28.

The detector 24 includes a controller 30. The controller 30 is configured to control the information device 26 based on the connecting state detected by the detector 24. The controller 30 is configured to control the information device 26 based on the electrical-load information detected by the detector 24. The controller 30 is configured to control the first indicator 28A based on the current detected by the first information detector 24A. The controller 30 is configured to control the second indicator 28B based on the current detected by the second information detector 24B. The controller 30 is configured to control the third indicator 28C based on the current detected by the third information detector 24C.

In this embodiment, the controller 30 includes a processor 30A and a memory 30B. The processor 30A includes a central processing unit (CPU) and a memory controller. The memory 30B includes a read only memory (ROM) and a random-access memory (RAM). The ROM includes a non-transitory computer-readable storage medium. The RAM includes a transitory computer-readable storage medium. The memory 30B includes storage areas each having an address in the ROM and the RAM. The controller 30 controls the memory 30B to store data in the storage areas of the memory 30B and reads data from the storage areas of the memory 30B.

The controller 30 includes a circuit board 30C and a bus 30D. The processor 30A, the memory 30B, the detector 24, and the information device 26 are electrically mounted on the circuit board 30C. The processor 30A, the memory 30B, the detector 24, and the information device 26 are electrically connected to the memory 30B via the circuit board 30C and the bus 30D. The memory 30B (e.g., the ROM) stores a program. The program is read into the processor 30A, and thereby the configuration and/or algorithm of the controller 30 is performed.

The information device 26 is configured to inform a state in which the electrical-load information is higher than a predetermined electrical load EL. In this embodiment, the memory 30B is configured to store the predetermined electrical load EL. For example, the predetermined electrical load EL is 1000 mA. However, the predetermined electrical load EL is not limited to this embodiment. The predetermined electrical load EL can be other values such as voltage and power consumption. The predetermined electrical load EL can be set to be other values.

The controller 30 is configured to turn on the first indicator 28A to emit the first light when the electrical-load information detected by the first information detector 24A of the detector 24 is equal to or lower than the predetermined electrical load EL. The controller 30 is configured to turn on the first indicator 28A to emit the second light when the electrical-load information detected by the first information detector 24A of the detector 24 is higher than the predetermined electrical load EL. The controller 30 is configured to turn on the second indicator 28B to emit the first light when the electrical-load information detected by the second information detector 24B of the detector 24 is equal to or lower than the predetermined electrical load EL. The controller 30 is configured to turn on the second indicator 28B to emit the second light when the electrical-load information detected by the second information detector 24B of the detector 24 is higher than the predetermined electrical load EL. The controller 30 is configured to turn on the third indicator 28C to emit the first light when the electrical-load information detected by the third information detector 24C of the detector 24 is equal to or lower than the predetermined electrical load EL. The controller 30 is configured to turn on the third indicator 28C to emit the second light when the electrical-load information detected by the third information detector 24C of the detector 24 is higher than the predetermined electrical load EL.

Each of the plurality of electric components EC has rated power consumption, a rated current, and a rated voltage. For example, a rated current of the transmission FD is RC7 mA. A rated current of the transmission RD is RC8 mA. A rated current of the suspension FS is RC4 mA. A rated current of the suspension RS is RC5 mA. A rated current of the seatpost assembly SA is RC6 mA. A rated current of the operating device DV1 is RC1 mA. A rated current of the operating device DV2 is RC2 mA. A rated current of the light emitting device LD is RC3 mA.

Figure 3:
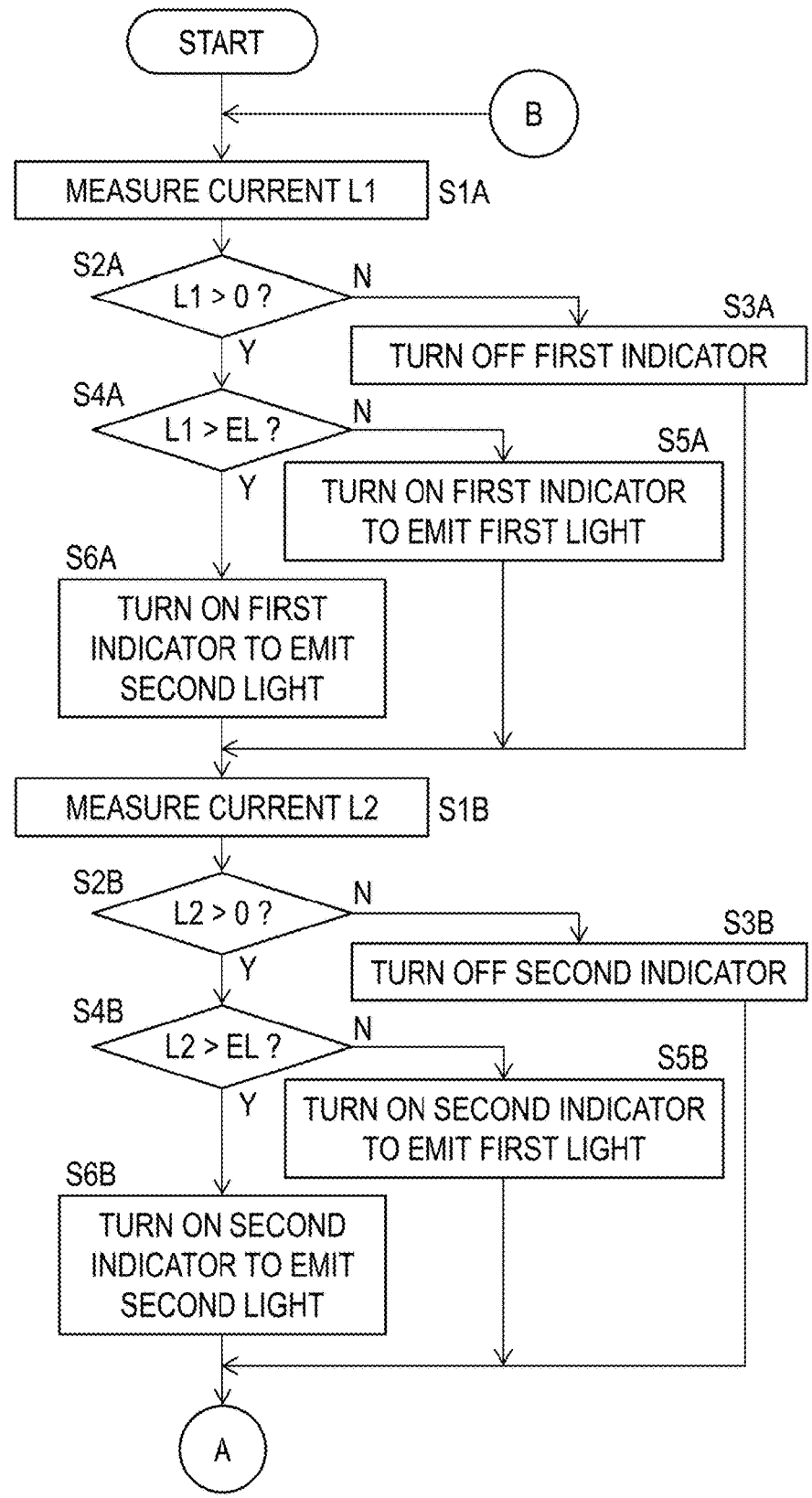
FIGS. 3 and 4 are flow charts of control of the connecting-state detection system illustrated in FIG. 1.

As seen in FIG. 3, the detector 24 detects the electrical-load information (e.g., current in this embodiment) (Steps S1A, S1B, and S1C). The controller 30 determines whether the electrical-load information detected by the detector 24 is higher than zero (Steps S2A, S2B, and S2C). The controller 30 turns off the display 28 of the information device 26 if the electrical-load information detected by the detector 24 is not higher than zero (Steps S3A, S3B, and S3C). The controller 30 determines whether the electrical-load information detected by the detector 24 is higher than the predetermined electrical load EL if the electrical-load information detected by the detector 24 is higher than zero (Steps S4A, S4B, and S4C). The controller 30 turns on the display 28 of the information device 26 in a first manner if the electrical-load information detected by the detector 24 is not higher than the predetermined electrical load EL (Steps S5A, S5B, and S5C). The controller 30 turns on the display 28 of the information device 26 in a second manner if the electrical-load information detected by the detector 24 is higher than the predetermined electrical load EL (Steps S6A, S6B, and S6C).

In this embodiment, the first information detector 24A measures the current L1 flowing from the electric power source 18 to the first connecting terminal 16A (Step S1A). The controller 30 determines whether the current L1 measured by the first information detector 24A is higher than zero (Step S2A). The controller 30 turns off the first indicator 28A if the current L1 measured by the first information detector 24A is not higher than zero (Step S3A). The controller 30 determines whether the current L1 measured by the first information detector 24A is higher than the predetermined electrical load EL if the current L1 measured by the first information detector 24A is higher than zero (Step S4A). The controller 30 turns on the first indicator 28A to emit the first light if the current L1 measured by the first information detector 24A is not higher than the predetermined electrical load EL (Step S5A). The controller 30 turns on the first indicator 28A to emit the second light if the current L1 measured by the first information detector 24A is higher than the predetermined electrical load EL (Step S6A).

The second information detector 24B measures the current L2 flowing from the electric power source 18 to the second connecting terminal 16B (Step S1B). The controller 30 determines whether the current L2 measured by the second information detector 24B is higher than zero (Step S2B). The controller 30 turns off the second indicator 28B if the current L2 measured by the second information detector 24B is not higher than zero (Step S3B). The controller 30 determines whether the current L2 measured by the second information detector 24B is higher than the predetermined electrical load EL if the current L2 measured by the second information detector 24B is higher than zero (Step S4B). The controller 30 turns on the second indicator 28B to emit the second light if the current L2 measured by the second information detector 24B is not higher than the predetermined electrical load EL (Step S5B). The controller 30 turns on the second indicator 28B to emit the second light if the current L2 measured by the second information detector 24B is higher than the predetermined electrical load EL (Step S6B).

Figure 4:
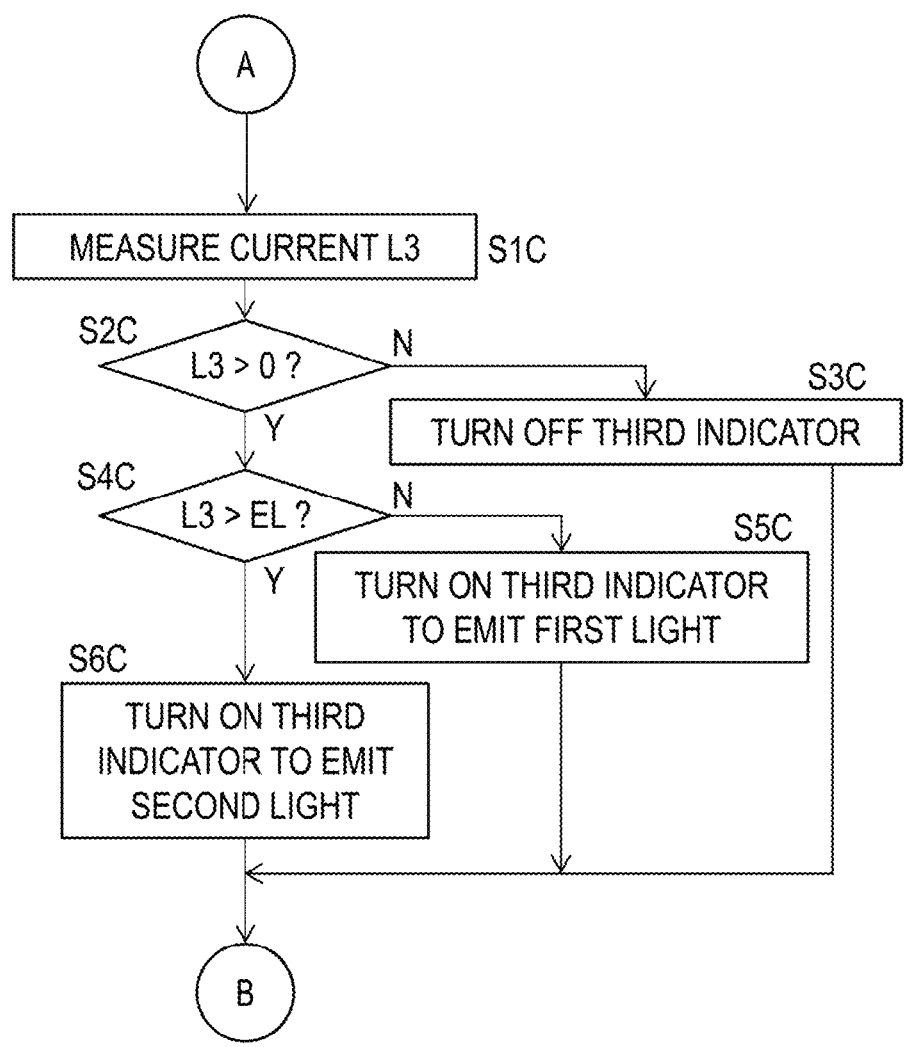

As seen in FIG. 4, the third information detector 24C measures the current L3 flowing from the electric power source 18 to the third connecting terminal 16C (Step S1C). The controller 30 determines whether the current L3 measured by the third information detector 24C is higher than zero (Step S2C). The controller 30 turns off the third indicator 28C if the current L3 measured by the third information detector 24C is not higher than zero (Step S3C). The controller 30 determines whether the current L3 measured by the third information detector 24C is higher than the predetermined electrical load EL if the current L3 measured by the third information detector 24C is higher than zero (Step S4C). The controller 30 turns on the third indicator 28C to emit the third light if the current L3 measured by the third information detector 24C is not higher than the predetermined electrical load EL (Step S5C). The controller 30 turns on the third indicator 28C to emit the second light if the current L3 measured by the third information detector 24C is higher than the predetermined electrical load EL (Step S6C). The process returns to the step S1A.

As seen in FIG. 2, for example, the current L1 having approximately RCT1 RC1+RC2+RC3+RC4) mA flows from the electric power source 18 to the first connecting terminal 16A since the rated currents of the operating device DV1, the operating device DV2, the light emitting device LD and the suspension FS are RC1 mA, RC2 mA, RC3 mA and RC4 mA. The current L3 having approximately RCT3 RC5+RC6+RC7+RC8) mA flows from the electric power source 18 to the third connecting terminal 16C since the rated current of each of the transmission FD, the transmission RD, the suspension RS and the seatpost assembly SA is RC5 mA, RC6 mA, RC7 mA and RC8 mA. The controller 30 turns on the first indicator 28A to emit the first light if the current value (e.g., RCT1 mA) measured by the first information detector 24A is higher than zero and lower than the predetermined electrical load EL (e.g., 1000 mA). On the other hand, the controller 30 turns on the first indicator 28A to emit the second light if the current value (e.g., RCT1 mA) measured by the first information detector 24A is higher than the predetermined electrical load EL. Similarly, the controller 30 turns on the third indicator 28C to emit the first light if the current value (e.g., RCT3 mA) measured by the third information detector 24C is higher than zero and lower than the predetermined electrical load EL. On the other hand, the controller 30 turns on the third indicator 28C to emit the second light if the current value (e.g., RCT3 mA) measured by the third information detector 24C is higher than the predetermined electrical load EL. Thus, the user can recognize that it is preferable to connect part of the electric components FD, RD, RS and SA to the second connecting terminal 16B, for example, if the current value (e.g., RCT1 mA) measured by the first information detector 24A is higher than the predetermined electrical load EL or if the current value (e.g., RCT3 mA) measured by the third information detector 24C is higher than the predetermined electrical load EL.

Second Embodiment

A connecting-state detection system 212 for the power supply system 10 of the human-powered vehicle VH in accordance with a second embodiment will be described below referring to FIGS. 5 to 8. The connecting-state detection system 212 has the same structure and/or configuration as those of the connecting-state detection system 12 except for the detector 24. Thus, elements having substantially the same function as those in the first embodiment will be numbered the same here and will not be described and/or illustrated again in detail here for the sake of brevity.

Figure 5:
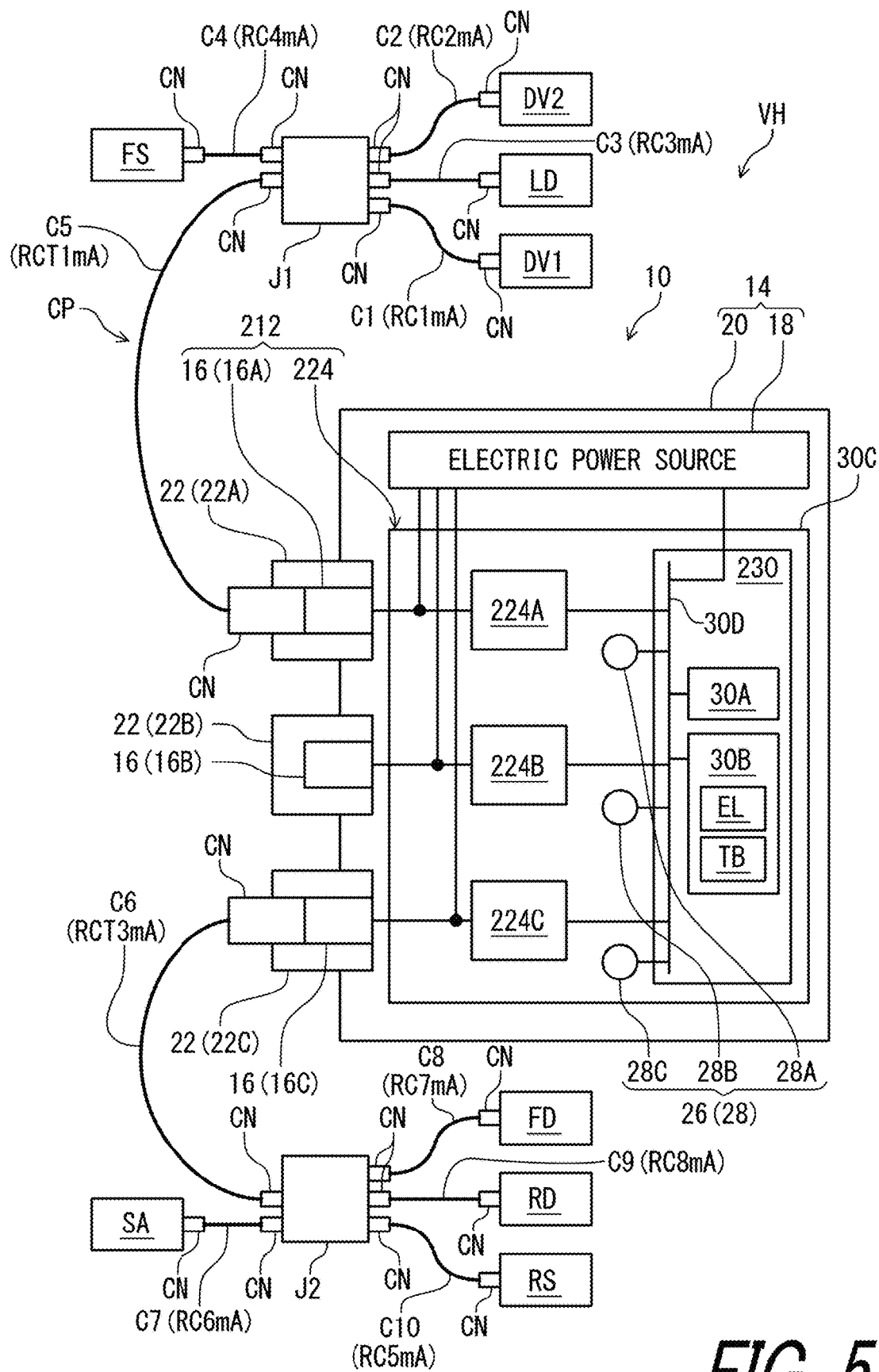
FIG. 5 is a schematic block diagram of a power supply system including a connecting-state detection system in accordance with a second embodiment.

As seen in FIG. 5, the connecting-state detection system 212 comprises a detector 224. The detector 224 is configured to detect a connecting state of each of the plurality of the connecting terminals 16. The detector 224 is configured to detect the electrical-load information of each of the plurality of the connecting terminals 16. The detector 224 is configured to detect at least one of a current applied to the plurality of connecting terminals 16, a voltage applied to the plurality of connecting terminals 16, a temperature applied to the plurality of connecting terminals 16, an identifier of at least one electric component of the plurality of electric components EC connected to the plurality of connecting terminals 16, and a total number of the plurality of electric components EC connected to the plurality of connecting terminals 16.

In this embodiment, the detector 224 is configured to detect the identifier of at least one electric component of the plurality of electric components EC connected to the plurality of connecting terminals 16. The detector 224 is configured to separate input signals to a power source voltage and information signals indicating the identifiers of the plurality of electric components EC. The detector 224 includes a first information detector 224A, a second information detector 224B, a third information detector 224C, and a controller 230. The controller 230 has substantially the same structure as the structure of the controller 30 of the first embodiment.

The first information detector 224A is configured to detect identifiers of the electric components EC connected to the first connecting terminal 16A. The first information detector 224A is configured to separate input signals to the power source voltage and information signals indicating the identifiers of the electric components EC connected to the first connecting terminal 16A. The controller 230 is configured to receive the identifiers detected by the first information detector 224A.

The second information detector 224B is configured to detect identifiers of the electric components EC connected to the second connecting terminal 16B. The second information detector 224B is configured to separate input signals to the power source voltage and information signals indicating the identifiers of the electric components EC connected to the second connecting terminal 16B. The controller 230 is configured to receive the identifiers detected by the second information detector 224B.

The third information detector 224C is configured to detect identifiers of the electric components EC connected to the third connecting terminal 16C. The third information detector 224C is configured to separate input signals to the power source voltage and information signals indicating the identifiers of the electric components EC connected to the third connecting terminal 16C. The controller 230 is configured to receive the identifiers detected by the third information detector 224C.

For example, the controller 230 is configured to send an identifier demand signal to each of the plurality of electric components EC via the electric communication path CP. Each of the electric components EC is configured to send an identifier signal to the detector 224 via the electric communication path CP in response to the identifier demand signal. Thus, each of the first to third information detectors 224A to 224C detects the identifier of the electric component EC connected to the connecting terminal 16.

The controller 230 is configured to control the information device 26 based on the connecting state detected by the detector 224. The controller 230 is configured to control the information device 26 based on the electrical-load information detected by the detector 224. The controller 230 is configured to control the first indicator 28A based on at least one identifier detected by the first information detector 224A. The controller 230 is configured to control the second indicator 28B based on at least one identifier detected by the second information detector 224B. The controller 230 is configured to control the third indicator 28C based on at least one identifier detected by the third information detector 224C. +

The detector 224 is configured to determine, based on the identifier of the at least one electric component of the plurality of electric components EC, a value indicating a load of the at least one electric component EC. The detector 224 is configured to calculate, based on the value indicating the load of the at least one electric component, a total indicating a total load of the at least one electric component EC connected to each of the plurality of connecting terminals 16. Examples of the value indicating the load of the at least one electric component EC includes a rated current, a rated voltage, and rated power consumption.

As seen in FIG. 6, the memory 30B is configured to store a table TB including rated currents of possible electric components connectable to the plurality of connecting terminals 16. The table TB illustrated in FIG. 6 further includes identifiers of the possible electric components. For example, the operating device DV1, the operating device DV2, the light emitting device LD, the suspension FS, the suspension RS, the seatpost assembly SA, the transmission FD, and the transmission RD respectively have identifiers ID1 to ID8. In this embodiment, the controller 230 is configured to select, from among the rated currents of the possible electric components listed in the table TB stored in the memory 30B, rated currents of electric components corresponding to the at least one identifier detected by the detector 224. The controller 230 is configured to calculate a total of the selected related currents of electric components connected to each of the plurality of connecting terminals 16.

The controller 230 is configured to select, from among the rated currents of the possible electric components listed in the table TB stored in the memory 30B, rated currents of electric components corresponding to the at least one identifier detected by the first information detector 224A. The controller 230 is configured to calculate a total of the selected rated currents of electric components connected to the first connecting terminal 16A based on the at least one identifiers detected by the first information detector 224A.

The controller 230 is configured to select, from among the rated currents of the possible electric components listed in the table TB stored in the memory 30B, rated currents of electric components corresponding to the at least one identifier detected by the second information detector 224B. The controller 230 is configured to calculate a total of the selected rated currents of electric components connected to the second connecting terminal 16B based on the at least one identifiers detected by the second information detector 224B.

The controller 230 is configured to select, from among the rated currents of the possible electric components listed in the table TB stored in the memory 30B, rated currents of electric components corresponding to the at least one identifier detected by the third information detector 224C. The controller 230 is configured to calculate a total of the selected rated currents of electric components connected to the third connecting terminal 16C based on the at least one identifiers detected by the third information detector 224C.

The controller 230 is configured to turn on the first indicator 28A to emit the first light when the electrical-load information detected by the first information detector 224A of the detector 224 is equal to or lower than the predetermined electrical load EL. The controller 230 is configured to turn on the first indicator 28A to emit the second light when the electrical-load information detected by the first information detector 224A of the detector 224 is higher than the predetermined electrical load EL. The controller 230 is configured to turn on the second indicator 28B to emit the first light when the electrical-load information detected by the second information detector 224B of the detector 224 is equal to or lower than the predetermined electrical load EL. The controller 230 is configured to turn on the second indicator 28B to emit the second light when the electrical-load information detected by the second information detector 224B of the detector 224 is higher than the predetermined electrical load EL. The controller 230 is configured to turn on the third indicator 28C to emit the first light when the electrical-load information detected by the third information detector 224C of the detector 224 is equal to or lower than the predetermined electrical load EL. The controller 230 is configured to turn on the third indicator 28C to emit the second light when the electrical-load information detected by the third information detector 224C of the detector 224 is higher than the predetermined electrical load EL.

Figure 7:
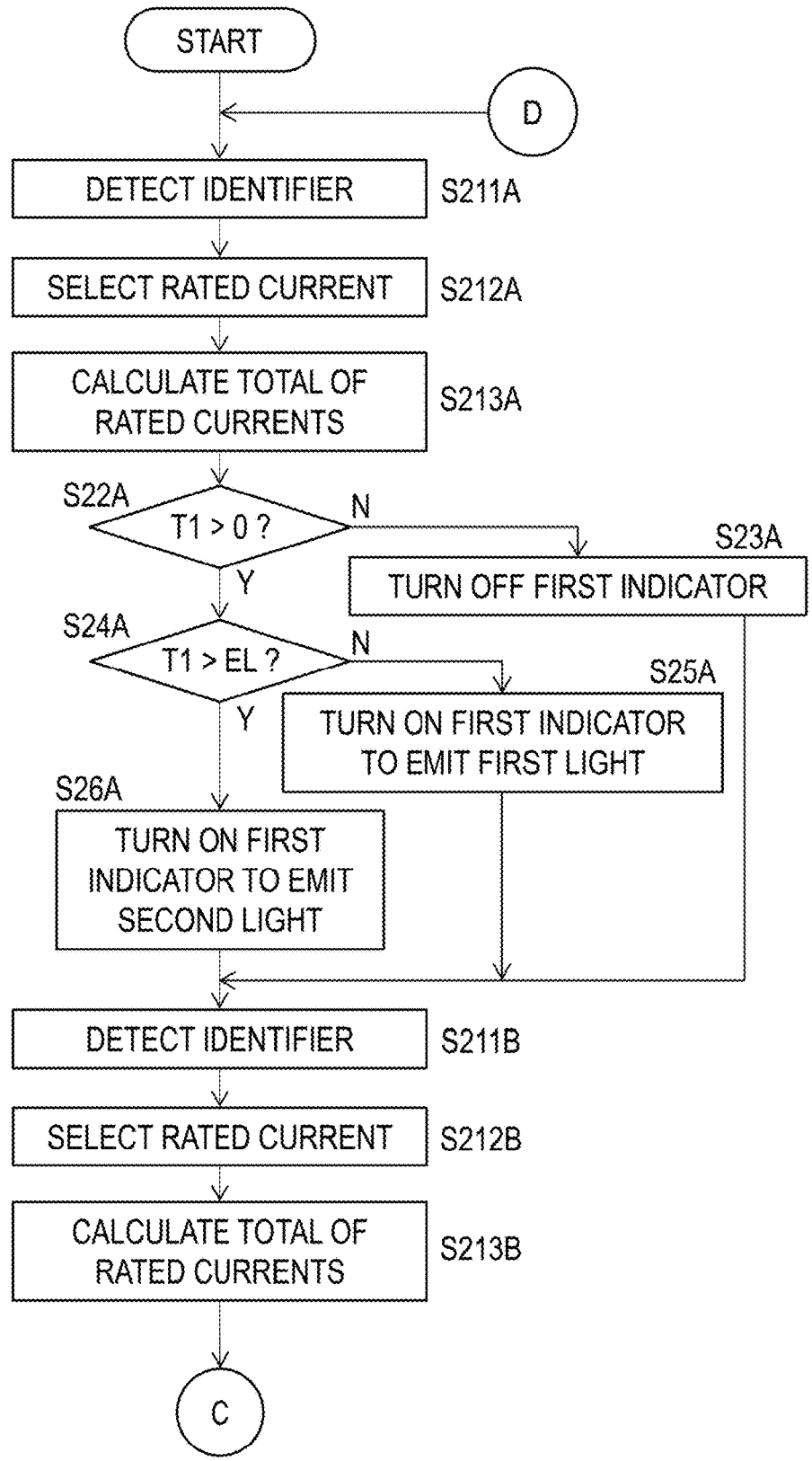
FIGS. 7 and 8 are flow charts of control of the connecting-state detection system illustrated in FIG. 5.

As seen in FIG. 7, the detector 224 detects the electrical-load information (Steps S211A to S213A, S211B to S213B, and S211C to S213C). Specifically, the detector 224 detects the identifier of the electric component EC connected to each of the plurality of connecting terminals 16 (Steps S211A, S211B, and S211C). The detector 224 selects, from among the rated currents of the possible electric components listed in the table TB stored in the memory 30B, rated currents of electric components corresponding to the at least one identifier detected by the detector 224 (Steps S212A, S212B, and S212C). The controller 230 calculates a total of the selected related currents of the electric components connected to each of the plurality of connecting terminals 16 (Steps S213A, S213B, and S213C).

The controller 230 determines whether the electrical-load information detected by the detector 224 is higher than zero (Steps S22A, S22B, and S22C). The controller 230 turns off the display 28 of the information device 26 if the electrical-load information detected by the detector 224 is not higher than zero (Steps S23A, S23B, and S23C). The controller 230 determines whether the electrical-load information detected by the detector 224 is higher than the predetermined electrical load EL if the electrical-load information detected by the detector 224 is higher than zero (Steps S24A, S24B, and S24C). The controller 230 turns on the display 28 of the information device 26 in a first manner if the electrical-load information detected by the detector 224 is not higher than the predetermined electrical load EL (Steps S25A, S25B, and S25C). The controller 230 turns on the display 28 of the information device 26 in a second manner if the electrical-load information detected by the detector 224 is higher than the predetermined electrical load EL (Steps S26A, S26B, and S26C).

As seen in FIG. 7, the first information detector 224A detects the identifier of the electric component EC connected to the first connecting terminal 16A (Step S211A). The detector 224 selects, from among the rated currents of the possible electric components listed in the table TB stored in the memory 30B, rated currents of electric components corresponding to the at least one identifier detected by the first information detector 224A (Step S212A). The controller 230 calculates a total T1 of the selected rated currents of the electric components EC connected to the first connecting terminal 16A (Step S213A).

The controller 230 determines whether the total T1 calculated by the controller 230 is higher than zero (Step S22A). The controller 230 turns off the first indicator 28A if the total T1 calculated by the controller 230 is not higher than zero (Step S23A). The controller 230 determines whether the total T1 calculated by the controller 230 is higher than the predetermined electrical load EL if the total T1 calculated by the controller 230 is higher than zero (Step S24A). The controller 230 turns on the first indicator 28A to emit the first light if the total T1 calculated by the controller 230 is not higher than the predetermined electrical load EL (Step S25A). The controller 230 turns on the first indicator 28A to emit the second light if the total T1 calculated by the controller 230 is higher than the predetermined electrical load EL (Step S26A).

The second information detector 224B detects the identifier of the electric component EC connected to the second connecting terminal 16B (Step S211B). The detector 224 selects, from among the rated currents of the possible electric components listed in the table TB stored in the memory 30B, rated currents of electric components corresponding to the at least one identifier detected by the second information detector 224B (Step S212B). The controller 230 calculates a total T2 of the selected rated currents of the electric components EC connected to the second connecting terminal 16B (Step S213B).

Figure 8:
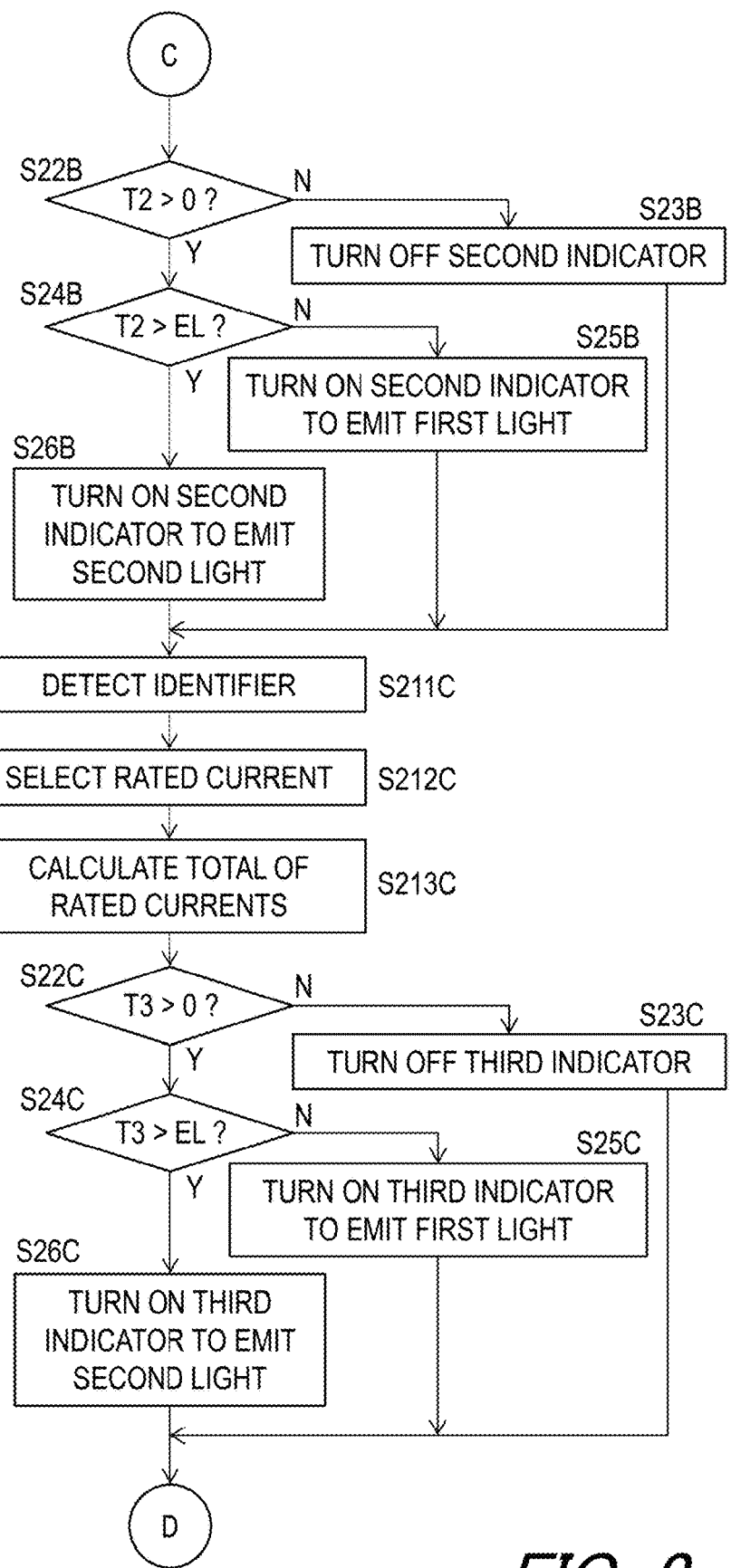

As seen in FIG. 8, the controller 230 determines whether the total T2 calculated by the controller 230 is higher than zero (Step S22B). The controller 230 turns off the second indicator 28B if the total T2 calculated by the controller 230 is not higher than zero (Step S23B). The controller 230 determines whether the total T2 calculated by the controller 230 is higher than the predetermined electrical load EL if the total T2 calculated by the controller 230 is higher than zero (Step S24B). The controller 230 turns on the second indicator 28B to emit the first light if the total T2 calculated by the controller 230 is not higher than the predetermined electrical load EL (Step S25B). The controller 230 turns on the second indicator 28B to emit the second light if the total T2 calculated by the controller 230 is higher than the predetermined electrical load EL (Step S26B).

The third information detector 224C detects the identifier of the electric component EC connected to the third connecting terminal 16C (Step S211C). The detector 224 selects, from among the rated currents of the possible electric components listed in the table TB stored in the memory 30B, rated currents of electric components corresponding to the at least one identifier detected by the third information detector 224C (Step S212C). The controller 230 calculates a total T3 of the selected rated currents of the electric components EC connected to the third connecting terminal 16C (Step S213C).

The controller 230 determines whether the total T3 calculated by the controller 230 is higher than zero (Step S22C). The controller 230 turns off the third indicator 28C if the total T3 calculated by the controller 230 is not higher than zero (Step S23C). The controller 230 determines whether the total T3 calculated by the controller 230 is higher than the predetermined electrical load EL if the total T3 calculated by the controller 230 is higher than zero (Step S24C). The controller 230 turns on the third indicator 28C to emit the first light if the total T3 calculated by the controller 230 is not higher than the predetermined electrical load EL (Step S25C). The controller 230 turns on the third indicator 28C to emit the second light if the total T3 calculated by the controller 230 is higher than the predetermined electrical load EL (Step S26C). The process returns to the step S211A.

Third Embodiment

A connecting-state detection system 312 for the power supply system 10 of the human-powered vehicle VH in accordance with a third embodiment will be described below referring to FIGS. 9 to 11. The connecting-state detection system 312 has the same structure and/or configuration as those of the connecting-state detection system 212 except for the controller 230 and the information device 26. Thus, elements having substantially the same function as those in the above embodiments will be numbered the same here and will not be described and/or illustrated again in detail here for the sake of brevity.

Figure 9:
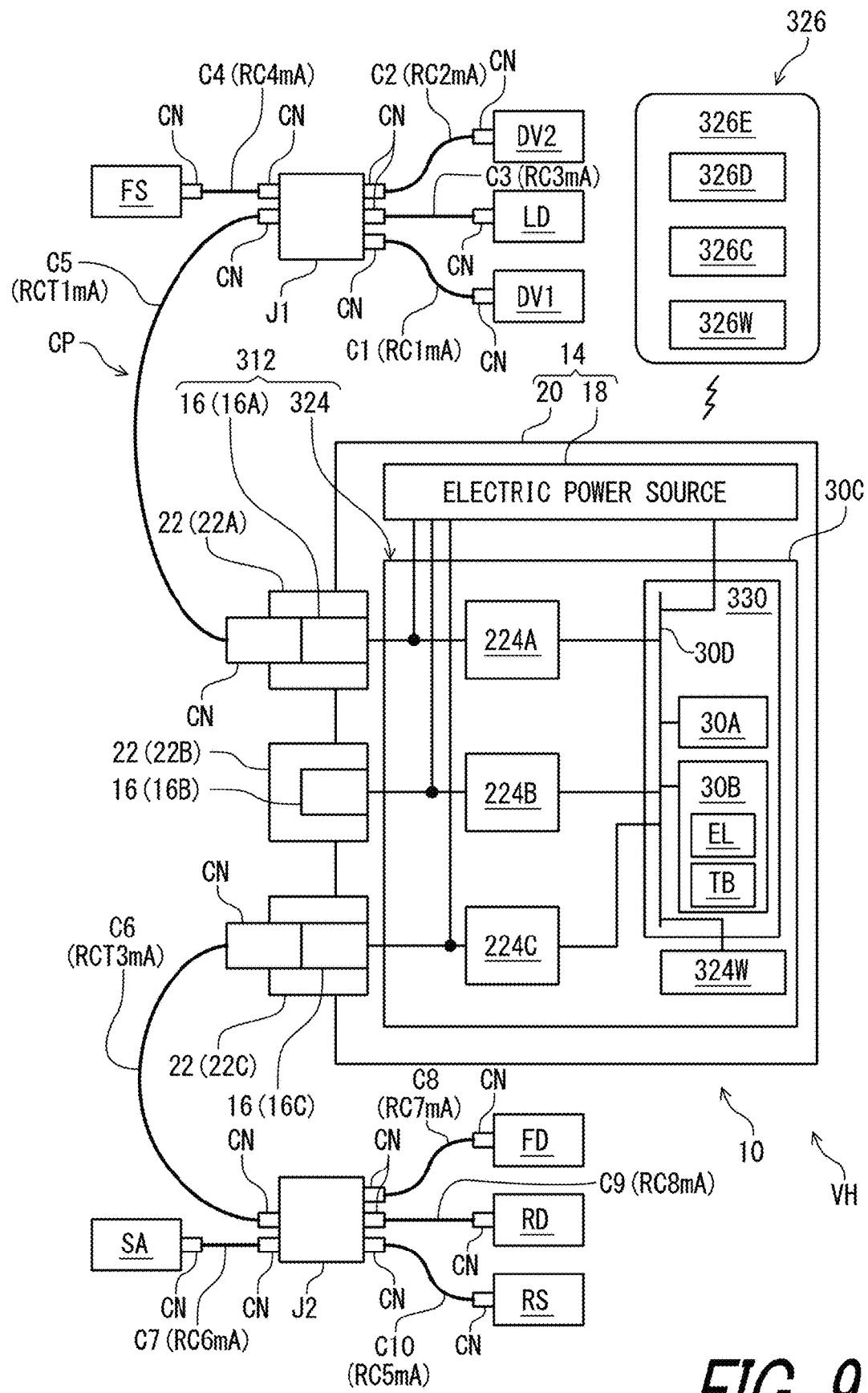
FIG. 9 is a schematic block diagram of a power supply system including a connecting-state detection system in accordance with a third embodiment.

As seen in FIG. 9, the connecting-state detection system 312 comprises a detector 324. The detector 324 is configured to detect a connecting state of each of the plurality of the connecting terminals 16. The detector 324 is configured to detect the electrical-load information of each of the plurality of the connecting terminals 16. The detector 324 is configured to detect at least one of a current applied to the plurality of connecting terminals, a voltage applied to the plurality of connecting terminals, a temperature applied to the plurality of connecting terminals, an identifier of each of a plurality of electric components connected to the plurality of connecting terminals, and a total number of the plurality of electric components connected to the plurality of connecting terminals.

In this embodiment, the detector 324 includes the first information detector 224A, the second information detector 224B, the detector indicator 224C, and a controller 330. The controller 330 has substantially the same structure as the structure of the controller 230 of the second embodiment. The controller 330 has substantially the same algorithm as the algorithm of the controller 230 described in the first embodiment.

The connecting-state detection system 312 further comprises an information device 326. The information device 326 is configured to inform the connecting state between the plurality of the connecting terminals 16 and the plurality of electric components EC connected to the plurality of the connecting terminals 16. The information device 326 is configured to inform a state in which the electrical-load information is higher than the predetermined electrical load EL. The controller 330 is configured to control the information device 326 based on the connecting state detected by the detector 324.

The information device 326 includes an external device 326E separately provided with respect to the one of the human-powered vehicle VH and the power supply system 10. In this embodiment, the external device 326E is separately provided from the power supply system 10. In this embodiment, the external device 326E includes a cycle computer. However, the external device 326E can be other electric devices such as a smartphone, and a tablet computer, and a personal computer.

In this embodiment, the information device 326 is configured to be connected to a wireless communicator 326W. The wireless communicator 326W is configured to wirelessly communicate with the detector 324. The information device 326 includes a display 326D. The display 324D is configured to display information relating to the human-powered vehicle VH. In this embodiment, the external device 326E includes the wireless communicator 326W and the display 326D.

The information device 326 includes an information controller 326C. The information controller 326C is electrically connected to the wireless communicator 326W and the display 326D. The information controller 326C is configured to control the display 326D to display information received by the wireless communicator 326W. In this embodiment, the external device 326E includes the information controller 326C.

For example, the information controller 326C includes a processor and a memory. The processor includes a CPU and a memory controller. The memory includes a ROM and a RAM. The ROM includes a non-transitory computer-readable storage medium. The RAM includes a transitory computer-readable storage medium. The memory includes storage areas each having an address in the ROM and the RAM. The information controller 326C controls the memory to store data in the storage areas of the memory and reads data from the storage areas of the memory.

The detector 324 includes a wireless communicator 324W. The wireless communicator 324W is configured to wirelessly communicate with the wireless communicator 326W of the information device 326. The controller 330 of the detector 324 is configured to control the wireless communicator 324W to wirelessly transmit the electrical-load information detected by the detector 324 and values calculated by the controller 330. In this embodiment, the controller 330 is configured to control the wireless communicator 324W to wirelessly transmit the totals T1, T2, and T3 calculated by the controller 330. For example, the wireless communicator 324W is configured to wirelessly transmit the identifiers detected by the detector 324 and the totals T1, T2, and T3 calculated by the detector 324 to the wireless communicator 326W of the information device 326. However, the detector 324 can be configured to communicate with the information device 326 via an electric cable.

The information controller 326C is configured to control the display 326D to display the connecting state wirelessly transmitted from the detector 324. The information controller 326C is configured to control the display 326D to display the electrical-load information wirelessly transmitted from the detector 324. The information controller 326C is configured to control the display 326D to display the identifiers and the totals T1, T2, and T3 which are wirelessly transmitted from wireless communicator 324W to the wireless communicator 326W.

The information device 326 is configured to inform a connecting suggestion in accordance with comparison of the electrical-load information between the plurality of the connecting terminals 16. For example, the connecting suggestion includes a suggestion that a connection position of at least one component of the electric components EC is preferably changed from one connecting terminal 16 through which the highest current flows among the plurality of connecting terminals 16 to another connecting terminal 16 through which the lowest current flows among the plurality of connecting terminals 16 if the highest current is higher than the predetermined electrical load EL.

In this embodiment, the controller 330 is configured to create the connecting suggestion based on the connecting state detected by the detector 324. Specifically, the controller 330 is configured to create the connecting suggestion based on the electrical-load information detected by the detector 324. The controller 330 is configured to compare each of the totals T1, T2, and T3 with the predetermined electrical load EL to determine whether each of the totals T1, T2, and T3 is higher than the predetermined electrical load EL. The controller 330 is configured to compare the totals T1, T2, and T3 with each other. The controller 330 is configured to select the highest total and the lowest total from among the totals T1, T2, and T3. The controller 330 is configured to create the connecting suggestion in accordance with the comparison of the electrical-load information between the plurality of the connecting terminals 16.

Figure 10:
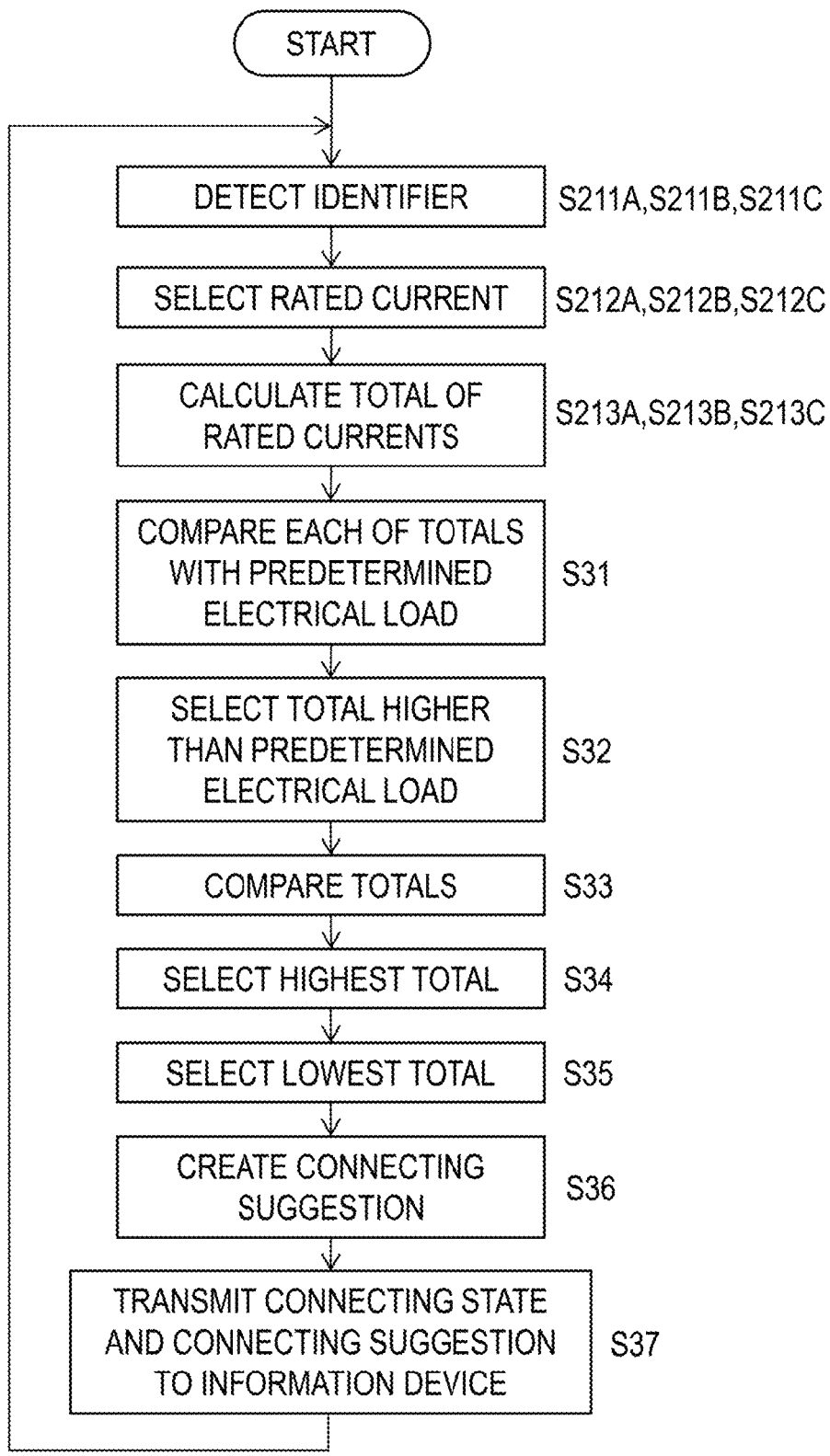
FIG. 10 is a flow chart of control of the connecting-state detection system illustrated in FIG. 9.

As seen in FIG. 10, as with the detector 224 of the first embodiment, the detector 324 detects the connecting state each of the plurality of the connecting terminals 16. Specifically, the detector 324 detects the identifier of the electric component EC connected to each of the plurality of connecting terminals 16 (Steps S211A, S211B, and S211C). The detector 324 selects, from among the rated currents of the possible electric components listed in the table TB stored in the memory 30B, rated currents of electric components corresponding to the at least one identifier detected by the detector 324 (Steps S212A, S212B, and S212C). The controller 230 calculates a total of the selected related currents of the electric components connected to each of the plurality of connecting terminals 16 (Steps S213A, S213B, and S213C).

The controller 330 compares each of the totals T1, T2, and T3 with the predetermined electrical load EL to determine whether each of the totals T1, T2, and T3 is higher than the predetermined electrical load EL (Step S31). The controller 330 selects the total which is higher than the predetermined electrical load EL from among the totals T1, T2, and T3 (Step S32). The controller 330 compares the totals T1, T2, and T3 with each other (Step S33). The controller 330 select the highest total and the lowest total from among the totals T1, T2, and T3 (Steps S34 and S35). The controller 330 is configured to create the connecting suggestion in accordance with the comparison of the electrical-load information between the plurality of the connecting terminals 16 (Step S36). For example, the controller 30 is configured to create the connecting suggestion that the electric component EC having the highest rated current in the group of electric components EC connected to the connecting terminal 16 having the highest total should be connected to the connecting terminal 16 having the lowest total. The controller 330 controls the wireless communicator 324W to wirelessly transmit the connecting state and the connecting suggestion to the information device 326 (Step S37). The process returns to the step S211A.

Figure 11:
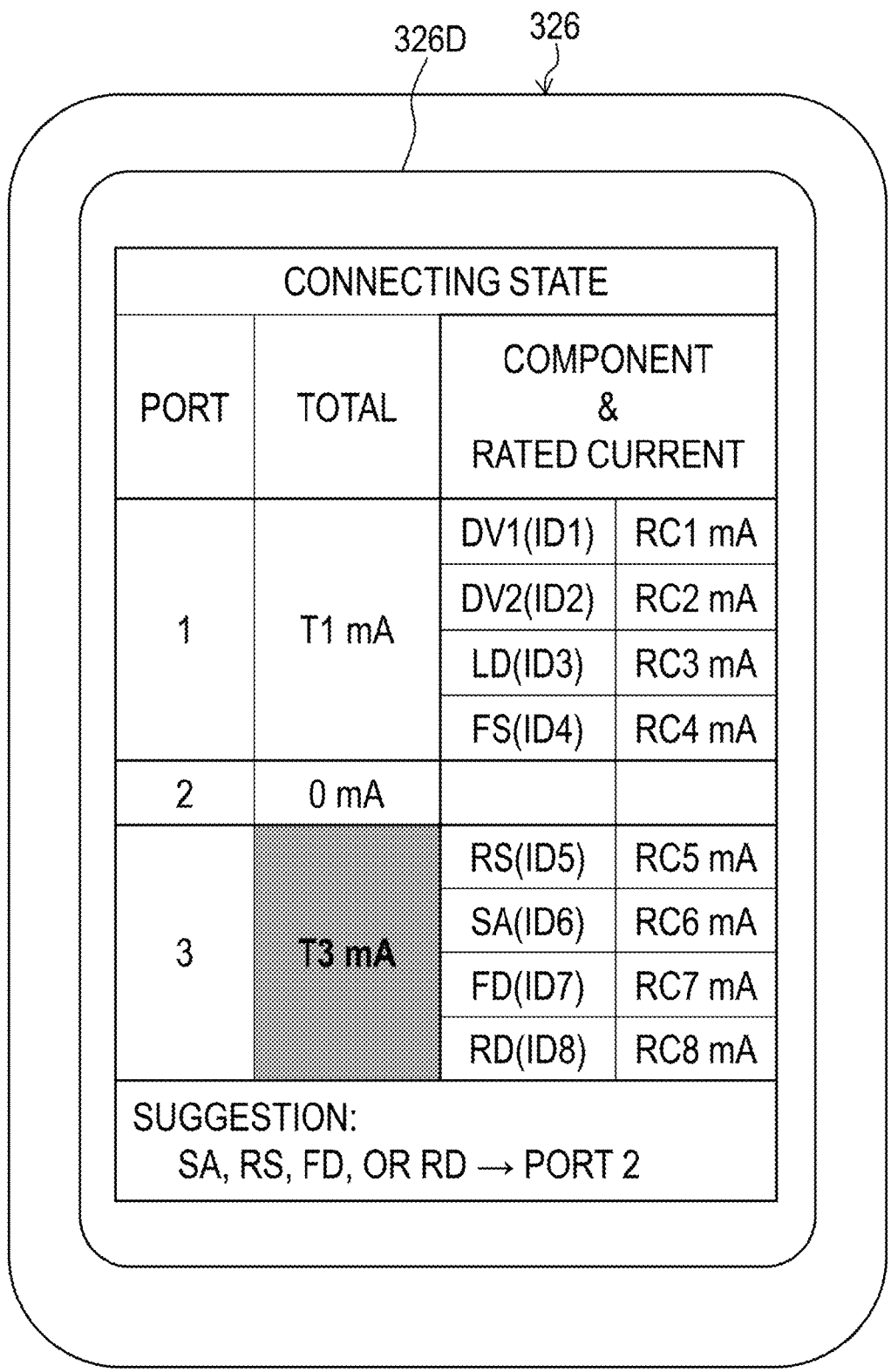
FIG. 11 is an example of a display of an information device of the power supply system illustrated in FIG. 9.

As seen in FIG. 11, the information controller 326C is configured to control the display 326D to display the connecting state and the connecting suggestion which are wirelessly transmitted from the detector 324. The information controller 326C is configured to control the display 326D to display the first to third connecting terminals 16A to 16C as ports 1 to 3 and display the totals T1 to T3 corresponding to the first to third connecting terminals 16A to 16C (e.g., the ports 1 to 3). The information controller 326C is configured to control the display 326D to display the electric components EC connected to each of the first to third connecting terminals 16A to 16C (e.g., the ports 1 to 3). For example, the information controller 326C is configured to control the display 326D to highlight the total T3 which is higher than the predetermined electrical load EL. The information controller 326C is configured to control the display 326D to display the connecting suggestion which is created by and wirelessly transmitted from the detector 324.

Fourth Embodiment

A connecting-state detection system 412 for the power supply system 10 of the human-powered vehicle VH in accordance with a fourth embodiment will be described below referring to FIG. 12. The connecting-state detection system 412 has the same structure and/or configuration as those of the connecting-state detection system 412 except for the controller 330 and the information device 326. Thus, elements having substantially the same function as those in the above embodiments will be numbered the same here and will not be described and/or illustrated again in detail here for the sake of brevity.

Figure 12:
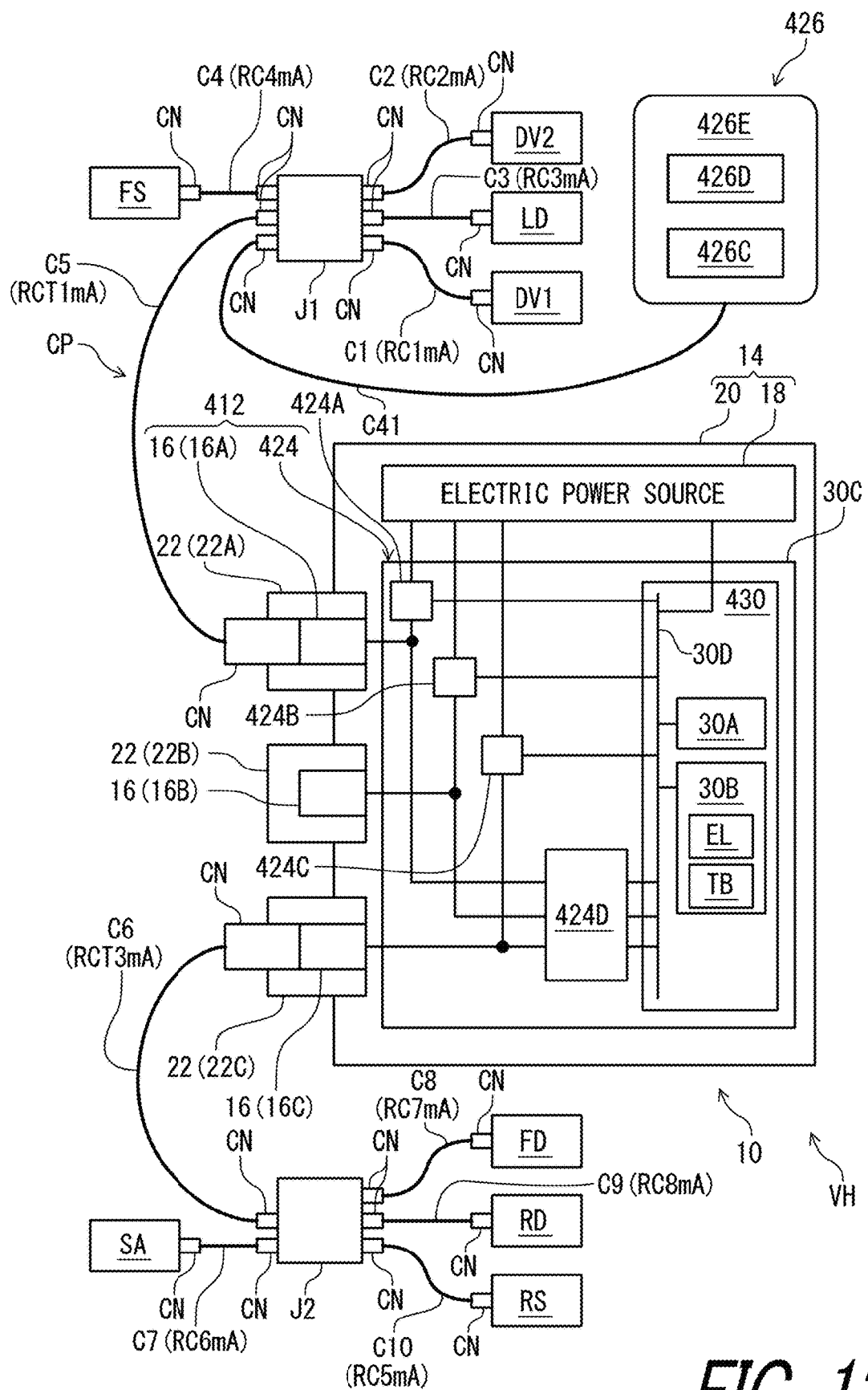
FIG. 12 is a schematic block diagram of a power supply system including a connecting-state detection system in accordance with a fourth embodiment.

As seen in FIG. 12, the connecting-state detection system 412 comprises a detector 424. The detector 424 is configured to detect a connecting state of each of the plurality of the connecting terminals 16. The detector 424 is configured to detect the electrical-load information of each of the plurality of the connecting terminals 16. The detector 424 is configured to detect at least one of a current applied to the plurality of connecting terminals, a voltage applied to the plurality of connecting terminals, a temperature applied to the plurality of connecting terminals, an identifier of each of a plurality of electric components connected to the plurality of connecting terminals, and a total number of the plurality of electric components connected to the plurality of connecting terminals.

In this embodiment, the detector 424 includes an information detector 424D. The information detector 424D is configured to detect the electrical-load information relating to the first to third connecting terminals 16A to 16C. In this embodiment, the information detector 424D is configured to detect identifiers of the electric components EC connected to the first to third connecting terminals 16A to 16C. Namely, the first to third information detectors 224A to 224C are integrated with each other to provide the information detector 424D.

The detector 424 includes a first switching part 424A, a second switching part 424B, and a third switching part 424C. The first switching part 424A is provided between the first connecting terminal 16A and the electric power source 18. The second switching part 424B is provided between the second connecting terminal 16B and the electric power source 18. The third switching part 424C is provided between the third connecting terminal 16C and the electric power source 18. The first switching part 424A is configured to connect and disconnect the first connecting terminal 16A to and from the electric power source 18. The second switching part 424B is configured to connect and disconnect the second connecting terminal 16B to and from the electric power source 18. The third switching part 424C is configured to connect and disconnect the third connecting terminal 16C to and from the electric power source 18.

The detector 424 includes a controller 430. The controller 430 has substantially the same structure as the structure of the controller 330 of the third embodiment. The controller 430 has substantially the same algorithm as the algorithm of the controller 330 described in the third embodiment. The wireless communicator 324W is omitted from the detector 424.

The controller 430 is configured to control the first switching part 424A to connect and disconnect the first connecting terminal 16A to and from the electric power source 18. The controller 430 is configured to control the second switching part 424B to connect and disconnect the second connecting terminal 16B to and from the electric power source 18. The controller 430 is configured to control the third switching part 424C to connect and disconnect the third connecting terminal 16C to and from the electric power source 18.

The connecting-state detection system 412 further comprises an information device 426. The information device 426 is configured to inform the connecting state between the plurality of the connecting terminals 16 and the plurality of electric components EC connected to the plurality of the connecting terminals 16. The information device 426 is configured to inform a state in which the electrical-load information is higher than the predetermined electrical load EL. The controller 430 is configured to control the information device 426 based on the connecting state detected by the detector 424.

The information device 426 includes an external device 426E separately provided with respect to the one of the human-powered vehicle VII and the power supply system 10. In this embodiment, the external device 426E is separately provided from the power supply system 10. In this embodiment, the external device 426E includes a personal computer. The external device 426E is electrically connected to the first junction J1 via an electric cable C41. The external device 426E can be electrically connected to other components electrically connected to the power supply device 14 via the electric communication path CP. In this embodiment, for example, the settings of the human-powered vehicle VII using the external device 426E during the maintenance of the human-powered vehicle VII.

In this embodiment, the information device 426 includes a display 426D. The display 324D is configured to display information relating to the human-powered vehicle VH. In this embodiment, the external device 426E includes the wireless communicator 426W.

The information device 426 includes an user input device 426F. The user input device 426F is configured to receive a user input. Examples of the user input device 426F include a keyboard and a touch screen. In this embodiment, the external device 426E includes the user input device 426F.

The information device 426 includes an information controller 426C. The information controller 426C is electrically connected to the display 426D and the user input device 426F. The information controller 426C is configured to control the display 426D to display information received from the detector 424. In this embodiment, the external device 426E includes the information controller 426C.

For example, the information controller 426C includes a processor and a memory. The processor includes a CPU and a memory controller. The memory includes a ROM and a RAM. The ROM includes a non-transitory computer-readable storage medium. The RAM includes a transitory computer-readable storage medium. The memory includes storage areas each having an address in the ROM and the RAM. The information controller 426C controls the memory to store data in the storage areas of the memory and reads data from the storage areas of the memory.

The information controller 426C is configured to communicate with the controller 430 of the detector 424 based on the user input received by the user input device 426F. For example, the information controller 426C is configured to transmit a detection command to the controller 430 to detect the electrical-load information of the plurality of connecting terminals 16 when the user input device 426F receives the user input indicating the detection of the electrical-load information.

Figure 13:
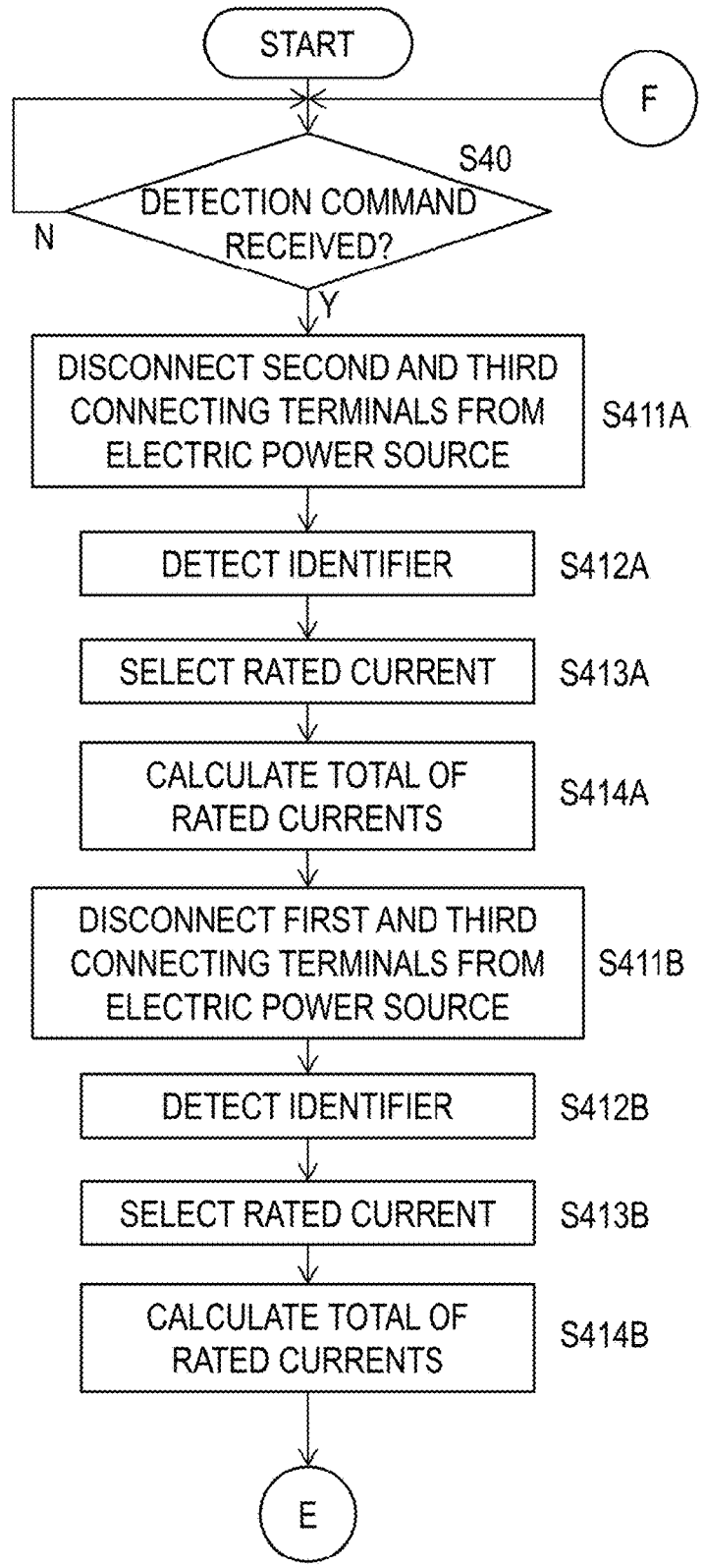
FIGS. 13 and 14 are flow charts of control of the connecting-state detection system illustrated in FIG. 12.

As seen in FIG. 13, the controller 430 is configured to control the first to third switching parts 424A to 424C to disconnect the first to third connecting terminals 16A to 16C from the electric power source 18 based on the detection command transmitted from the information controller 426C. The controller 430 is configured to determine if the controller 430 receives the detection command from the information device 426 (Step S40).

In this embodiment, the controller 430 is configured to control the second and third switching parts 424B and 424C to disconnect the second and third connecting terminals 16B and 16C from the electric power source 18 for a predetermined time based on the detection command transmitted from the information controller 426C (Step S411A). The controller 430 is configured to control the information detector 424D to detect the identifier while the second and third switching parts 424B and 424C respectively disconnect the second and third connecting terminals 16B and 16C from the electric power source 18 (Step S412A). Thus, the information detector 424D detects the identifier of the electric components EC connected to the first connecting terminal 16A.

The detector 424 selects, from among the rated currents of the possible electric components listed in the table TB stored in the memory 30B, rated currents of electric components corresponding to the identifier detected by the information detector 424D (Step S413A). The controller 430 calculates a total T1 of the selected rated currents of the electric components EC connected to the first connecting terminal 16A (Step S414A).

The controller 430 is configured to control the first and third switching parts 424A and 424C to disconnect the first and third connecting terminals 16A and 16C from the electric power source 18 for the predetermined time based on the detection command transmitted from the information controller 426C (Step S411B). The controller 430 is configured to control the information detector 424D to detect the identifier while the first and third switching parts 424A and 424C respectively disconnect the first and third connecting terminals 16A and 16C from the electric power source 18 (Step S412B). Thus, the information detector 424D detects the identifier of the electric components EC connected to the second connecting terminal 16B.

The detector 424 selects, from among the rated currents of the possible electric components listed in the table TB stored in the memory 30B, rated currents of electric components corresponding to the identifier detected by the information detector 424D (Step S413B). The controller 430 calculates a total T2 of the selected rated currents of the electric components EC connected to the second connecting terminal 16B (Step S414B).

Figure 14:
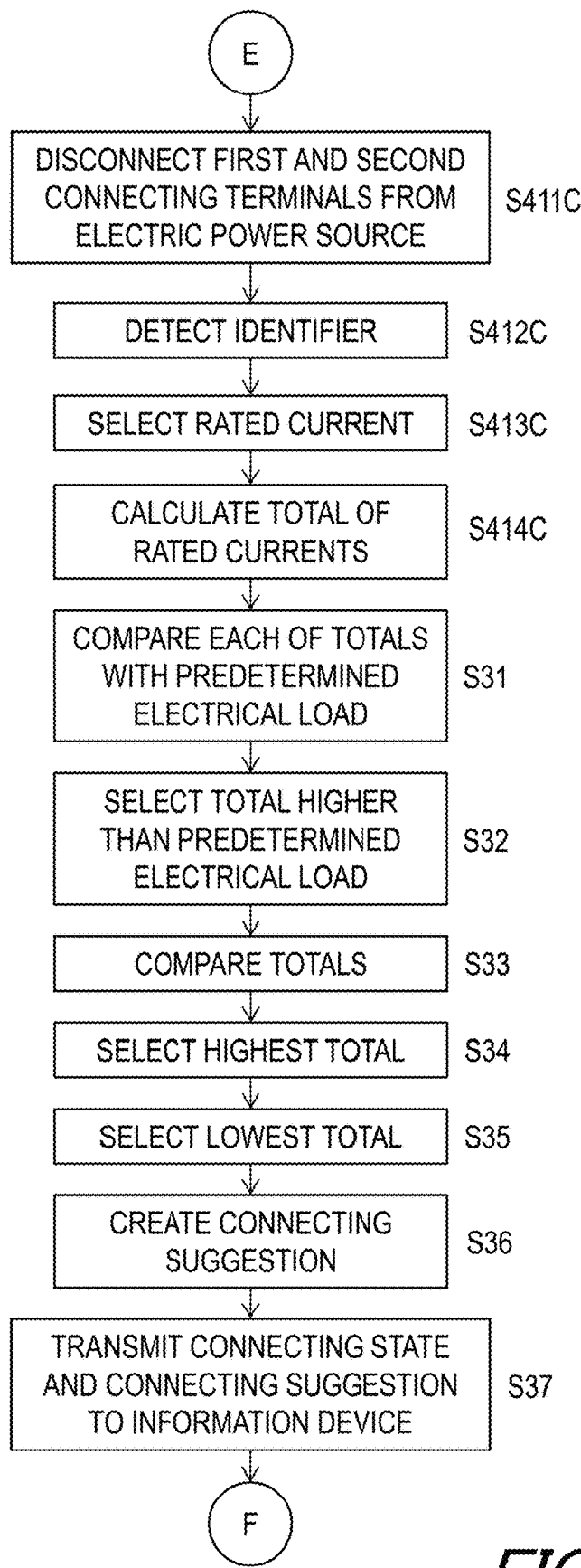

As seen in FIG. 14, the controller 430 is configured to control the first and second switching parts 424A and 424B to disconnect the first and second connecting terminals 16A and 16B from the electric power source 18 for the predetermined time based on the detection command transmitted from the information controller 426C (Step S411C). The controller 430 is configured to control the information detector 424D to detect the identifier while the first and second switching parts 424A and 424B respectively disconnect the first and second connecting terminals 16A and 16B from the electric power source 18 (Step S412C). Thus, the information detector 424D detects the identifier of the electric components EC connected to the third connecting terminal 16C.

The detector 424 selects, from among the rated currents of the possible electric components listed in the table TB stored in the memory 30B, rated currents of electric components corresponding to the identifier detected by the information detector 424D (Step S413C). The controller 430 calculates a total T3 of the selected rated currents of the electric components EC connected to the third connecting terminal 16C (Step S414C).

The steps S31 to S37 are substantially the same as the steps S31 to S37 described in the third embodiment. For example, the controller 330 is configured to transmit the connecting state and the connecting suggestion to the information device 426 via the electric communication path CP (Step S37). The process returns to the step S40.

As with the information device 326 of the third embodiment, the information device 426 is configured to inform a connecting suggestion in accordance with comparison of the electrical-load information between the plurality of the connecting terminals 16. As with the controller 330 of the detector 324 of the first embodiment, the controller 430 is configured to create the connecting suggestion based on the connecting state detected by the detector 424. The information device 426 has substantially the same algorithm as the algorithm of the controller 330 described in the third embodiment. The controller 430 has substantially the same algorithm as the algorithm of the controller 330 described in the third embodiment. Thus, they will not be described in detail here for the sake of brevity.

Modifications

In the first embodiment, the detector 24 is configured to detect the current applied to the plurality of connecting terminals 16. In the second to fourth embodiments, the detectors 224, 324, and 424 are configured to detect the identifier of each of the plurality of electric components EC connected to the plurality of connecting terminals 16. However, at least one of the detectors 24, 224, 324, and 424 can be configured to detect at least one of a voltage applied to the plurality of connecting terminals 16, a temperature applied to the plurality of connecting terminals 16, and a total number of the plurality of electric components EC connected to the plurality of connecting terminals 16. For example, the detector 24 of the first embodiment can be configured to detect a voltage applied to each of the first to third connecting terminals 16A to 16C instead of the current. The detector 24 of the first embodiment can be configured to detect a temperature applied to each of the first to third connecting terminals 16A to 16C instead of the current. Each of the detector 224, 324, and 424 can be configured to detect a total number of the electric components EC connected to each of the first to third connecting terminals 16A to 16C using the detected identifiers. It is possible to utilize the description of the connecting-state detection system 12 by replacing the current with each of the voltage and the temperature. It is possible to utilize the description of the connecting-state detection systems 212, 312, and 412 by replacing the identifiers with the total number of the electric components EC. Thus, they will not be described in detail here for the sake of brevity.

In the above embodiments, the connecting state includes electrical-load information relating to each of the plurality of the connecting terminals 16 when the plurality of electric components EC are in normal operation. However, the connecting state can include electrical-load information relating to each of the plurality of the connecting terminals 16 connected to at least one of the plurality of electric components EC which is in abnormal operation and/or sleep mode. For example, the current flowing through the connecting terminal 16 may increase or decrease in comparison with a normal value such as a rated current value if at least one of the electric components EC is in abnormal operation. The current flowing through the connecting terminal 16 may decrease in comparison with the normal value such as the rated current value if at least one of the electric components EC is in sleep mode. The connecting-state detection system can be used for detecting such states of the plurality of electric components EC. In such modifications, the information device can be configured to inform such states of the plurality of electric components EC.

The term "comprising" and its derivatives, as used herein, are intended to be open ended terms that specify the presence of the stated features, elements, components, groups, integers, and/or steps, but do not exclude the presence of other unstated features, elements, components, groups, integers and/or steps. This concept also applies to words of similar meaning, for example, the terms "have," "include" and their derivatives.

The terms "member," "section," "portion," "part," "element," "body" and "structure" when used in the singular can have the dual meaning of a single part or a plurality of parts.

The ordinal numbers such as "first" and "second" recited in the present application are merely identifiers, but do not have any other meanings, for example, a particular order and the like. Moreover, for example, the term "first element" itself does not imply an existence of "second element," and the term "second element" itself does not imply an existence of "first element."

The term "pair of," as used herein, can encompass the configuration in which the pair of elements have different shapes or structures from each other in addition to the configuration in which the pair of elements have the same shapes or structures as each other.

The terms "a" (or "an"), "one or more" and "at least one" can be used interchangeably herein.

The phrase "at least one of" as used in this disclosure means "one or more" of a desired choice. For one example, the phrase "at least one of" as used in this disclosure means "only one single choice" or "both of two choices" if the number of its choices is two. For other example, the phrase "at least one of" as used in this disclosure means "only one single choice" or "any combination of equal to or more than two choices" if the number of its choices is equal to or more than three. For instance, the phrase "at least one of A and B" encompasses (1) A alone, (2), B alone, and (3) both A and B. The phrase "at least one of A, B, and C" encompasses (1) A alone, (2), B alone, (3) C alone, (4) both A and B, (5) both B and C, (6) both A and C, and (7) all A, B, and C. In other words, the phrase "at least one of A and B" does not mean "at least one of A and at least one of B" in this disclosure.

Finally, terms of degree such as "substantially," "about" and "approximately" as used herein mean a reasonable amount of deviation of the modified term such that the end result is not significantly changed. All of numerical values described in the present application can be construed as including the terms such as "substantially," "about" and "approximately."

Obviously, numerous modifications and variations of the present invention are possible in light of the above teachings. It is therefore to be understood that within the scope of the appended claims, the invention may be practiced otherwise than as specifically described herein.

What is claimed is:

1. A connecting-state detection system for a power supply system of a human-powered vehicle, the power supply system including a power supply device having a plurality of connecting terminals, the connecting-state detection system comprising:
   a detector configured to detect a connecting state of each of the plurality of the connecting terminals.

2. The connecting-state detection system according to claim 1, wherein
   the plurality of connecting terminals includes at least three connecting terminals.

3. The connecting-state detection system according to claim 1, wherein
   the connecting state includes electrical-load information relating to each of the plurality of the connecting terminals, and
   the detector is configured to detect the electrical-load information of the plurality of the connecting terminals.

4. The connecting-state detection system according to claim 3, wherein
   the detector is configured to detect at least one of
      a current applied to the plurality of connecting terminals,
      a voltage applied to the plurality of connecting terminals,
      a temperature applied to the plurality of connecting terminals,
      an identifier of at least one electric component of a plurality of electric components connected to the plurality of connecting terminals, and
      a total number of the plurality of electric components connected to the plurality of connecting terminals.

5. The connecting-state detection system according to claim 4, wherein
   the detector is configured to determine, based on the identifier of the at least one electric component of the plurality of electric components, a value indicating a load of the at least one electric component.

6. The connecting-state detection system according to claim 5, wherein
   the detector is configured to calculate, based on the value indicating the load of the at least one electric component, a total indicating a total load of the at least one electric component connected to each of the plurality of connecting terminals.

7. The connecting-state detection system according to claim 1, further comprising
   an information device is configured to inform the connecting state between the plurality of the connecting terminals and a plurality of electric components connected to the plurality of the connecting terminals.

8. The connecting-state detection system according to claim 7, wherein
   the information device is configured to inform a state in which the electrical-load information is higher than a predetermined electrical load.

9. The connecting-state detection system according to claim 7, wherein
   the information device is configured to inform a connecting suggestion in accordance with comparison of the electrical-load information between the plurality of the connecting terminals.

10. The connecting-state detection system according to claim 7, wherein
    the information device is configured to be connected to a wireless communicator.

11. The connecting-state detection system according to claim 7, wherein
    the information device includes a display.

12. The connecting-state detection system according to claim 7, wherein
    the information device includes an external device separately provided with respect to the one of the human-powered vehicle and the power supply system.

13. The connecting-state detection system according to claim 1, wherein
    the detector is provided to the power supply device.

14. The connecting-state detection system according to claim 1, wherein
    the plurality of electric components includes at least one of a transmission, a suspension, a seatpost assembly, an operating device, and a light emitting device.

15. The connecting-state detection system according to claim 1, wherein
    the detector is configured to be electrically connected to the plurality of connecting terminals.

16. The connecting-state detection system according to claim 1, wherein
    the plurality of connecting terminals are provided in a plurality of connection ports, and
    the detector is configured to detect the connecting state of each of the plurality of the connecting terminals in the plurality of connection ports.

\* \* \* \* \*